(12) United States Patent
Fujita

(10) Patent No.: US 6,262,923 B1
(45) Date of Patent: Jul. 17, 2001

(54) SEMICONDUCTOR MEMORY DEVICE WITH REDUNDANCY FUNCTION

(75) Inventor: Mamoru Fujita, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/339,264

(22) Filed: Jun. 23, 1999

Related U.S. Application Data

(63) Continuation-in-part of application No. 09/262,257, filed on Mar. 4, 1999.

(30) Foreign Application Priority Data

Mar. 16, 1998 (JP) .................................................. 10-065468
Jun. 26, 1998 (JP) .................................................. 10-181063

(51) Int. Cl.$^7$ .................................................. G11C 7/00
(52) U.S. Cl. .................. 365/200; 365/222; 365/225.7; 365/230.03
(58) Field of Search .............................. 365/200, 230.03, 365/222, 225.7, 189.01, 230.01

(56) References Cited

U.S. PATENT DOCUMENTS 5,796,664 * 1/2000 Tsuruda et al. ...................... 365/200
5,808,948 * 9/1998 Kim et al. ............................. 365/201
5,822,257 * 10/1998 Ogawa ................................... 365/200
6,018,482 * 1/2000 Fujita .................................... 365/200

* cited by examiner

*Primary Examiner*—Hoai V. Ho
(74) *Attorney, Agent, or Firm*—Scully, Scott, Murphy & Presser

(57) ABSTRACT

A semiconductor memory device having redundant memory selection circuit XRDN which outputs a redundant replacement selection signal for each bank. In a refreshing operation, each redundant decoder XRED only compares an address indicated by row address signal XADD with an address of a defective memory cell stored, without referring to a bank selection signal included in row address signal XADD. Redundant memory cell selection circuit XRDN outputs redundant replacement selection signals XRDNS (A), (B) for respective banks A, B, for indicating a bank in which the replacement is to be performed with a redundant memory cell.

9 Claims, 25 Drawing Sheets

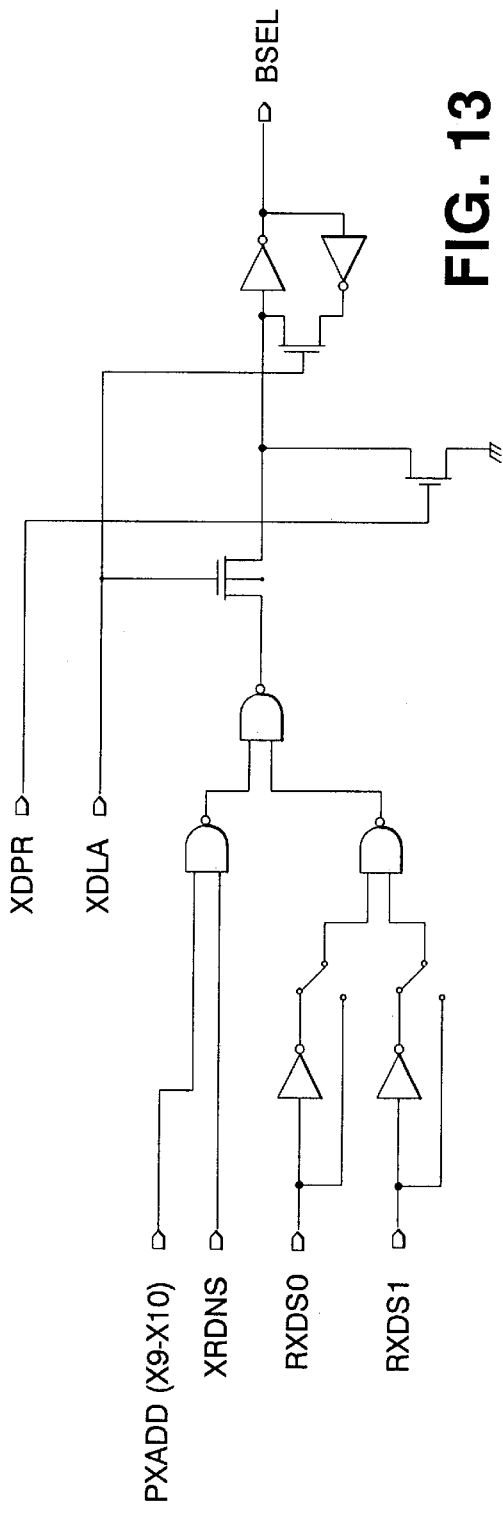
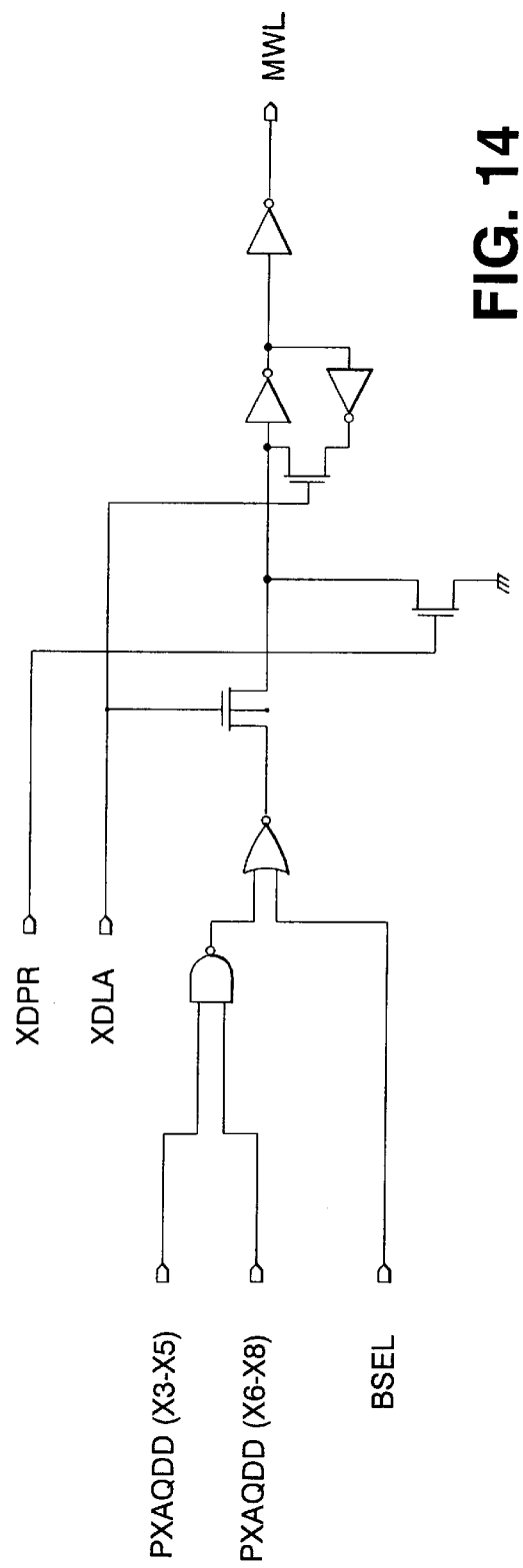
FIG. 13
FIG. 14

SEMICONDUCTOR MEMORY DEVICE WITH REDUNDANCY FUNCTION

CROSS REFERENCE TO RELATED APPLICATION

The present application is a continuation-in-part of application Ser. No. 09/262,257 filed on Mar. 4, 1999.

BACKGROUND OF THE INVENTION

1. Field of the Invention

The present invention relates to a semiconductor memory device, and more particularly to a semiconductor memory device with remedying means for defective memory cells.

2. Description of the Related Art

A semiconductor memory device such as a DRAM (Dynamic Random Access Memory) is provided with respective memory cells at intersection points of a plurality of pairs of bit lines and a plurality of word lines. In this semiconductor memory device, the word line is selected with a row address and the pair of bit lines is selected with a column address to thereby allow the stored information of an intended memory cell to be read.

A conventional semiconductor memory device such as a DRAM employs a scheme of dividing a storage area into a plurality of blocks for an increased storage capacity or due to limitations on the length of the pair of bit lines.

For reading stored information stored in a memory cell of a semiconductor memory device comprising such a plurality of blocks, a row address is first specified, then a column address is specified and a block address must be specified. After the addresses are specified, a command is provided from the outside, thereby performing various operations such as data writing or reading.

However, even if the semiconductor memory device comprises a plurality of blocks as described above, there exists a problem that an increased storage capacity and an increased number of blocks require a long time for reading the stored content when one block can not be processed while another block is being processed.

For solving this problem, a synchronous DRAM and the like have come into use in which memory cells are divided into banks which can operate independent of each other, not dividing the memory cells into a plurality of blocks.

Within each bank, a group of memory cells specified with an address signal applied from the outside are activated. At this time, respective banks can be simultaneously in an activated state. The addresses of the group of memory cells to be activated are independent among the respective banks.

FIG. 1 shows a configuration of a conventional semiconductor memory device comprising such a plurality of banks.

In this figure, description is made assuming that the number of banks is two [bank A (ARRAY0) and bank B (ARRAY1)], the number of subarrays forming each bank is four (SA00 to SA03, SA10 to SA13, respectively), and the number of subword lines (not shown) included in each subarray is 512. Also, description is made here by using a hierarchy word lines structure. In this case, the number of the subword lines are eight for one main word line MWL. Thus, the row address of each bank comprises 11 bits (X0 to X10). Each subarray in each bank is identified by bits X9, X10, each main word line in each subarray is identified by bits X3 to X8, and each of eight subword line for one main word line is identified by bits X0 to X2.

The replacement of a defective memory cell with a redundant memory cell is performed by two row addresses designated by bit X0. Each subarray has one redundant main word line RMWL (Redundant MWL) and eight subword lines connected thereto.

FIGS. 2A and 2B show timing charts illustrating the operation of this conventional semiconductor memory device. FIG. 2A is a timing chart when the redundant memory cell is selected, while FIG. 2B is a timing chart when the redundant memory cell is not selected. ACT in FIGS. 2A and 2B denotes a signal indicating that a bank corresponding to each ACT is in an activated state, and is generated by a command decoder (not shown) and the like in response to a command input from the outside.

In FIG. 1, XADD comprising 11 bits is a row address signal and is fetched from the outside in accordance with ACT signal by an address buffer (not shown). XABF denotes a row address signal buffer circuit and generates complementary signals X1N to X10N, X1T to X10T in accordance with X1 to X10 within row address signals XADD. Respective redundant decoders XRED are circuits which store respective defective addresses to be replaced and perform storage/comparison for defective addresses.

FIG. 3 is a circuit diagram showing an example of redundant decoder XRED as described above. Redundant decoder XRED compares row address signal XADD and the defective address stored therein.

In this conventional semiconductor memory device, the replacement is made with two subword lines as a unit, so that X1 to X10 making up row address signal XADD are stored. Subword lines designated by X0, for example row address 0 and row address 1 are not distinguished within redundant decoder XRED and are determined as defective addresses when either of them is applied to redundant decoder XRED.

In redundant decoder XRED, the replacement address is stored by disconnecting either of fuses F1N to F10N or F1T to F10T. Although the way of disconnecting the fuse is not particularly limited, fusion with laser beam is commonly used. Disconnection of either FnN or FnT causes one bit of the replacement address to be stored. For example, when the relevant bit in the replacement address is 0 or 1, F1N to F10N are disconnected and F1T to F10T are not disconnected.

Next, the operation of redundant decoder XRED will be described. First, all of row address signal XADD go to a low level and redundant precharge signal PXR goes to a low level, thereby causing node 100 to go to a high level. Subsequently, based on an address signal applied from the outside, the states X1N to X10N and X1T and X10T are set within the complementary signals of 11 bits making up row address signal XADD. At this time, since XnN and XnT (n=1 to 10) are complementary signals, one of them is at a high level and the other is at a low level. For example, when the row address is 0 or 1, X1N to X10N are at a high level and X1T to X10T are at a low level. Thus, node 100 and node 101 are rendered conductive unless the replacement address stored in fuses FnN, FnT and row address signal XADD match.

Node 100 goes to a low level when redundant precharge signal PXR goes to a high level and the replacement address and row address signal XADD do not match, and node 100 remains at a high level when they match. Level at node 100 is held at node 102 in response to latch signal XLAT and outputted as defective address match signal XREBL. FIG. 2A shows a case where the replacement address and row address signal XADD match and defective address match signal XREBL at a high level is outputted. FIG. 2B shows a case where the replacement address and row address signal XADD do not match and defective address match signal XREBL at a low level is outputted.

When ACT signal goes to a low level, all defective address match signals XREBL are made unselected in response to XPRE signal as shown in FIGS. 2A and 2B, and therefore the selected redundant memory cell is made unselected.

FIG. 4 is a circuit diag ram showing an example of redundant memory cell selection circuit XRDN.

Redundant memory cell selection circuit XRDN exists on a one-to-one basis for each redundant row decoder RXDC. Since one redundant decoder XRED exists for two subword lines, one redundant memory cell selection 25 circuit XRDN exists for four redundant decoders XRED. This ratio is equal to the ratio of the number of the main word lines to the number of the subword lines. Redundant memory cell selection circuit XRDN, when one of four defective address match signals XREBL connected thereto goes to a high level, causes redundant replacement selection signal XRDNS set at a high level by a precharge circuit (not shown) to be pulled down to a low level. Redundant replacement selection signal XRDNS is a signal indicating that the redundant memory cell has been selected. Also, redundant memory cell selection circuit XRDN causes redundant row decoder selection signal RXDS to go to at a high level, and activates redundant row decoder RXDC connected on a one-to-one basis.

Additionally, redundant subword line selection signals RRAIS1, RRAIS2, set at a high level by a precharge circuit (not shown), are selectively pulled down to a low level in response to defective address match signal XREBL. RRAIS1, RRAIS2 are not pulled down to a low level when XREBL0 goes to a high level among four defective address match signals XREBL0 to XREBL3 connected to the redundant memory cell selection circuit XRDN. However, only RRAIS1 is pulled down when XREBL1 goes to a high level, only RRAIS2 is pulled down when XREBL2 goes to a high level, and both of redundant subword line selection signals RRAIS1, RRAIS2 are pull down when XREBL3 goes to a high level. Therefore, the comparison result in redundant decoder XRED matches the state of redundant subword line selection signal RRAIS signal.

Redundant decoder XRED and redundant memory cell selection circuit XRDN are fixed with respect to a bank to which each of them belongs and operate only when the relevant bank is selected. Also, each signal of redundant precharge signal PXR, latch signal XLAT, XPRE, redundant row decoder selection signal RXDS, redundant replacement selection signal XRDNS exists independently for each bank and operates independently.

XPR in FIG. 1 denotes a row address predecoder which generates row address predecode signal PXADD from row address signal XADD, as shown in FIGS. 2A and 2B. It is to be noted that row address predecode signal PXADD comprises eight signals including X3N, X4N, X5N to x3T, X4T, X5T obtained through predecoding X3 to X5, eight signals including X6N, X7N, X8N to X6T, X7T, X8T obtained through predecoding X6 to X8, and four signals including X9N, X10N to X9T, X10T obtained through predecoding X9, X10. Eight signals including X3T, X4T, X5T and so on and eight signals including X6T, X7T, X8T and so on are used for selecting row decoder XDEC in each subarray, while four signals including X9T, X10T and so on are used for selecting the subarray in SXC circuit. Row predecode address signal PXADD is delayed within row address decode circuit XPR in order to wait for determination whether the redundant memory cell is selected or not, and latched by latch signal XLAT signal. When ACT signal goes to a low level, all row predecode address signals PXADD are made unselected by XPRE signal. As a result, the selected memory cell is made unselected.

FIG. 5 is a circuit diagram showing an example of subarray selection circuit SXC. When row address signal XADD does not match any of the redundant defective replacement addresses stored in redundant decoders XRED and redundant row decoder selection signal RXDS remains at a high level, subarray selection circuit SXC activates a sense amplifier array, (not shown) included in the relevant subarray, and activates subarray selection signal BSEL, based on row predecode address signal PXADD (X9, X10).

When row address signal XADD matches any one of the defective replacement addresses stored in redundant decoders XRED and redundant row decoder selection signal RXDS goes to a low level, subarray selection circuit SXC activates a sense amplifier array based on redundant replacement selection signal XRDNS and activates subarray selection signal BSED. At this time, when the subarray indicated by row predecode address signal PXADD and the subarray indicated by redundant replacement selection signal XRDNS do not match, the redundant main word line and the sense amplifier array within the subarray indicated by row predecode address signal PXADD are inhibited to be activated. In any case, the sense amplifier array to be activated is included in the subarray containing the activated word line.

FIG. 6 is a circuit diagram showing an example of row decoder XDEC. Row decoder XDEC activates main word line MWL based on row predecode address signal PXADD (X3 to X8) and subarray selection signal BSEL. However, when row address signal XADD matches any one of the replacement addresses stored in redundant decoders XRED and the redundant row decoder selection signal goes to a low level, the activation will not be performed.

FIG. 7 is a circuit diagram showing an example of redundant row decoder RXDC. When row address signal XADD matches any of the replacement addresses stored in redundant decoders XRED, redundant row decoder RXDC will activate the corresponding redundant main word line RMWL based on redundant replacement selection signal XRDNS. Thus, a main word line including a defective address will be replaced with a redundant main word line.

FIG. 8 is a circuit diagram showing an example of subword line selection circuit RAIS. When row address signal XADD does not match any of the defective replacement addresses of redundant decoders XRED and redundant row decoder selection signal RXDS is at a high level, subword line selection circuit RAIS will activate only one of subword line selection signals RAI0 to RAI7 in accordance with row address signal XADD (X0 to X2). On the other hand, when row address signal XADD matches one of the defective replacement addresses of redundant decoders XRED and redundant row decoder selection signal RXDS is at a low level, redundant subword line selection signal RRAIS1 instead of X1 of row address signal XADD, redundant subword line selection signal RRAIS2 instead of X2, and X0 of row address signal XADD are used to select one of subword line selection signals RAI0 to RAI7. Main word line MWL and subword line selection signal RAI are applied to a subword driver circuit (not shown), and an AND logic of these signals is used to select subword line SWL. Subword line SWL is directly connected to the memory cell to activate the memory cell.

As described above, in this prior art, the relationship of redundant decoder XRED, the main word line activated thereby, and subword line selection signal RAI is fixed, which results in a fixed relationship of each redundant decoder XRED and the subword line. Also, the number of the subword lines (two in this case) to which one redundant decoder XRED is responsible for replacement is also fixed.

In this case, there exist four redundant main word lines per bank and 32 relevant subword lines. 16 redundant decoders XRED exist within one bank. Since the replacement by one redundant decoder XRED is performed with two subword lines having an address only differing in X0 as a unit, up to 16 defective points per bank can be remedied if each of all defective points has either only one row address or two addresses only differing in X0.

However, if each defective point does not have two addresses only differing in X0, for example if the main word line (corresponding to eight subword lines having an address only differing in X0 to X2) is defective, four redundant decoders XRED are used for replacement with eight subword lines. In this case, 16 redundant decoders XRED per bank can be used to remedy four main word lines. In any case, redundant decoder XRED circuit and redundant subword line used for the defect replacement are used only within each bank and are not used for the defect replacement of another banks.

However, in the aforementioned semiconductor memory device, for example when a defective memory cell physically existing in bank B is replaced with a redundant memory cell physically existing in bank A, two memory cells may be simultaneously activated in bank A if the redundant memory cell in bank A replacing the defective memory cell in bank B is to be activated at a timing which activates bank A. When these memory cells share a sense amplifier, a data line and so on, malfunction would occur. Since the addresses of two memory cells in different banks can be specified independently and optionally from the outside, this problem can not be avoided for all combinations of addresses.

Therefore, in the semiconductor memory device having a configuration such as shown in FIG. 1, it is impossible to remedy by sharing a redundant memory cell among different banks, so that a defective memory cell in each bank can be replaced only with the redundant memory cell in the same bank. Therefore, for a chip where defects locally exist in some banks, the whole chip can not be remedied at a time when a defective memory cell can not be replaced with a redundant memory cell even in one bank, which leads to a prime cause of reducing the yield.

Also, since cut of fuses with laser imposes a limitation on a finer fuse, a redundant decoder generally requires a larger area as compared with other circuits. Thus, the maximum number of redundant memory cells that can be provided is determined by the number of the redundant decoders that can be provided.

A semiconductor memory device has different patterns for the address arrangement of defective bits in terms of the structure and method of fabricating. These defective patterns are classified into a defective pattern which can be remedied by the replacement of one row address, such as a single bit defect caused by an element such as a transistor making up a memory cell and a single line defect caused by disconnection of a wiring in a memory cell array, and a defective pattern which can be remedied by replacement of a plurality of row addresses, such as a row decoder circuit defect and an adjacent lines defect caused by shorts among wirings in a memory cell array.

Also, even in a case where replacement of a plurality of lines is required, the number of adjacent row addresses requiring replacement is indefinite since it depends on the amount of dust accumulated during the step, which leads to a primary cause of shorts among wirings. Therefore, since in the prior art replacement of a defect for a fixed number of the row addresses is performed by one redundant decoder, a plurality of redundant decoders are needed to perform the replacement when the number of adjacent defective row addresses exceeds a replacement unit. Conversely, if the number of adjacent defective row addresses is below the replacement unit, replacement is performed including indefective the row address, adjacent to defective row address, thereby reducing the efficiency of using redundant memory cell.

In the conventional semiconductor memory devices, a redundancy decoder associated with one bank is capable of replacing only a defective memory cell in the bank with a redundant memory cell. Therefore, the banks need respective redundancy decoders. As a result, the efficiency with which to replace defective memory cells with redundant memory cells is low, resulting in a poor yield.

SUMMARY OF THE INVENTION

It is therefore an object of the present invention to provide a semiconductor memory device which has a redundancy decoder disposed commonly between banks for replacing defective memory cells occurring in the different banks with an increased efficiency, resulting in an improved yield.

It is another object of the present invention to provide a semiconductor memory device capable of refreshing even when respective defects may exist in different banks, in order to increase the replacement efficiency, thereby improving a yield.

To achieve the above object, a semiconductor memory device according to the present invention has redundancy decoders each comprising means for programming which bank's defect is to be replaced, and means for programming how many addresses are to be replaced. Specifically, the semiconductor memory device comprises a plurality of ordinary memory cells, means for activating the ordinary memory cells in response to addresses applied from an external source, a plurality of redundant memory cells, first storage means for storing the address of a defective memory cell among the ordinary memory cells, comparing means for comparing the addresses applied from the external source and the address of the defective memory cell with each other, and means for activating a redundant memory cell in response to an output from the comparing means and/or preventing the ordinary memory cells from being activated, the comparing means comprising means for comparing all or part of bits of the addresses applied from the external source and the stored address of the defective memory cell with each other.

The object can also be achieved by a semiconductor memory device having a timing control circuit for outputting a latch signal to latch the defective address agreement signal when a command to make a bank active is inputted, and outputting a signal to reset the defective address agreement signal a predetermined time after the latch signal is outputted. In this semiconductor memory device, the defective address agreement signal shared between the banks is made active and then inactive after elapse of a certain time. The semiconductor memory device allows a defective memory cell to be normally replaced with a redundant memory cell even when periods in which the banks are active overlap each other.

The object can also be achieved by a semiconductor memory device having a plurality of timing control circuits associated respectively with the banks, for outputting a latch signal to latch the defective address agreement signal when a command for making the corresponding banks active is inputted, and outputting a redundant circuit precharge signal to reset the defective address agreement signal when a command for precharging the corresponding banks is inputted, and a plurality of defective address agreement signal latch circuits for latching the defective address agreement signal and outputting the latched defective address agreement signal when the latch signal with respect to the corresponding banks is outputted, and resetting the latched defective address agreement signal when the redundant circuit precharge signal with respect to the corresponding banks is outputted. In this semiconductor memory device, the defective address agreement signal is latched by latch signals in the respective banks, and the latched signal is reset by the redundant circuit precharge signal. Therefore, the different banks can be made active independently of each other.

According to the present invention, even when the semiconductor memory device is writing data, reading data, or is refreshed, memory cells that belong to the different banks and are simultaneously activated can be replaced by one redundancy decoder. Therefore, the efficiency with which to replace defective memory cells is increased for thereby improving a yield of semiconductor memory devices.

The present invention is also applied to a semiconductor memory device having a memory cell block including a plurality of memory cells, a plurality of redundant memory cells for replacing defective memory cells in the memory cell block, a plurality of banks capable of reading/writing independently of each other, a plurality of redundant decoders, and replacement memory cell storage means. The redundant decoder is shared among the plurality of banks, stores the address of the defective memory cell, and compares an address indicated by an applied address signal with the address of the defective memory cell stored therein. The replacement memory cell storage means stores the address of a redundant memory cell for the replacement of the defect memory cell, and activates the redundant memory cell for replacing the defective memory cell when the address indicated by the address signal and the address of the defective memory cell matches the address stored in each of the redundant decoders.

The other object of the present invention is achieved by a semiconductor memory device in which the redundant decoder, in addition to the operation described above, compares the address indicated by an address signal with the stored address of a defective memory cell without referring to a bank selection signal included in the address signal in refreshing operation. The replacement memory cell storage means, in addition to the operation described above, outputs for each of the banks a redundant replacement selection signal indicative of a bank in which replacement is performed with a redundant memory cell.

In the refreshing operation, each of the redundant decoders compares the address indicated by the address signal with a address of the defective memory cell without referring to the bank selection signal included in the address signal. The replacement memory cell storage means outputs for each of the banks the redundant replacement selection signal indicative of a bank in which replacement is performed with a redundant memory cell.

Therefore, a determination is made as to whether replacement is performed or not for each bank even in the refreshing when a plurality of banks are simultaneously activated, so that the replacement of memory cells which belong to the plurality of banks and simultaneously activated can be performed by the common redundant decoder. As a result, yields can be improved due to an increased replacement efficiency.

The above and other objects, features, and advantages of the present invention will become apparent from the following description with references to the accompanying drawings which illustrate examples of the present invention.

BRIEF DESCRIPTION OF THE DRAWINGS

FIG. 13 is a circuit diagram of a subarray selecting circuit SXC in the semiconductor memory device shown in FIG. 9;

FIG. 14 is a circuit diagram of a row decoder XDEC in the semiconductor memory device shown in FIG. 9;

DESCRIPTION OF THE PREFERRED EMBODIMENTS

Figure 1:
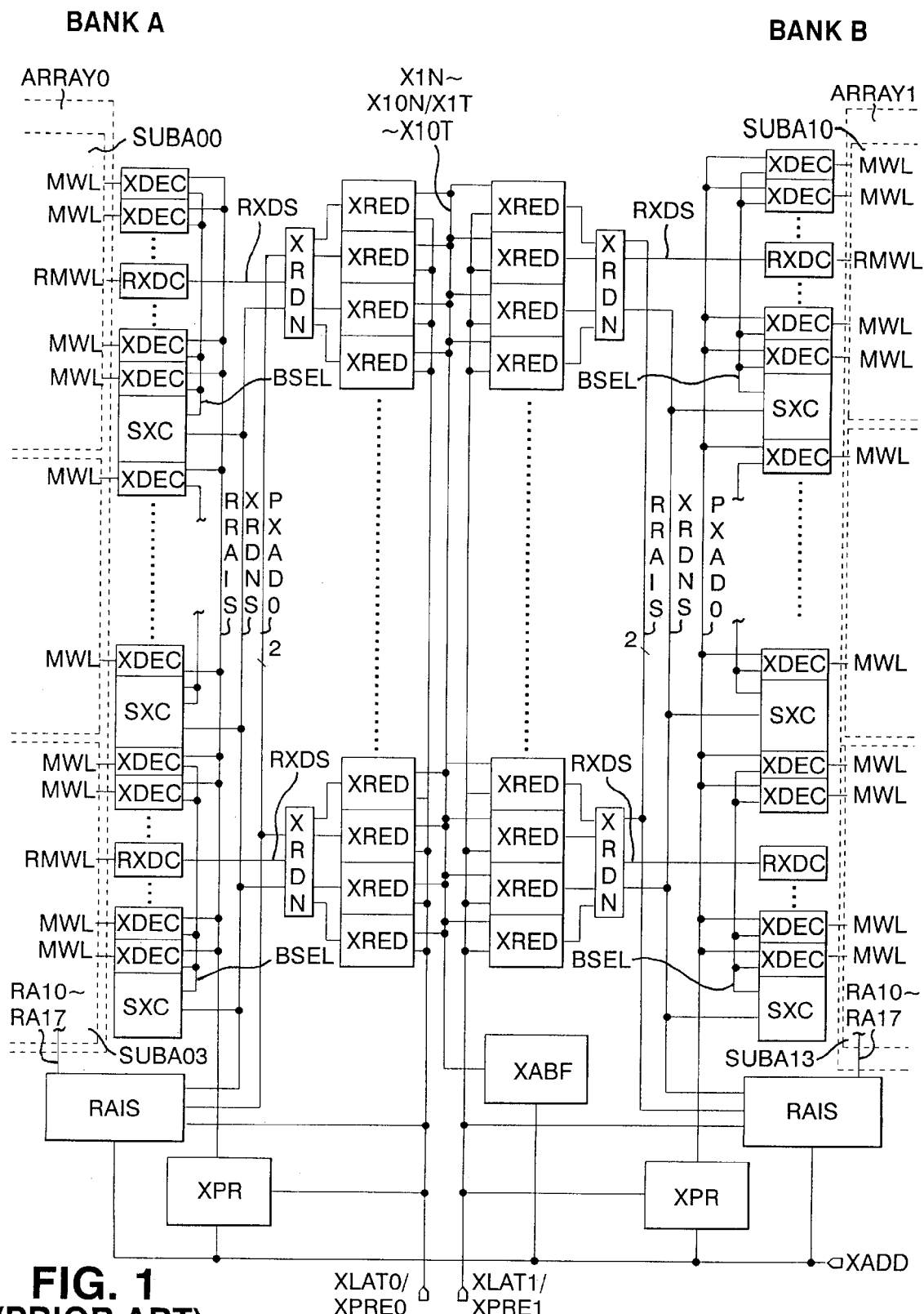
FIG. 1 is a block diagram showing a configuration of a conventional semiconductor memory device.
Figure 2A:
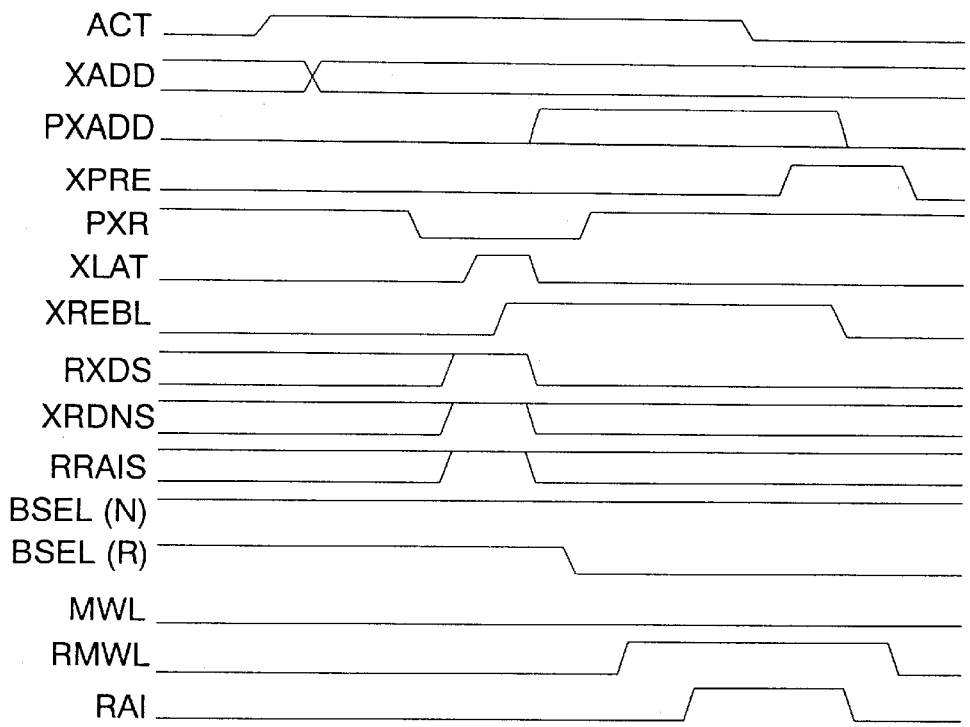
FIGS. 2A and 2B are timing charts showing the operation of the semiconductor memory device shown in FIG. 1 when a defective address is selected and when a defective address is not selected, respectively.
Figure 2B:
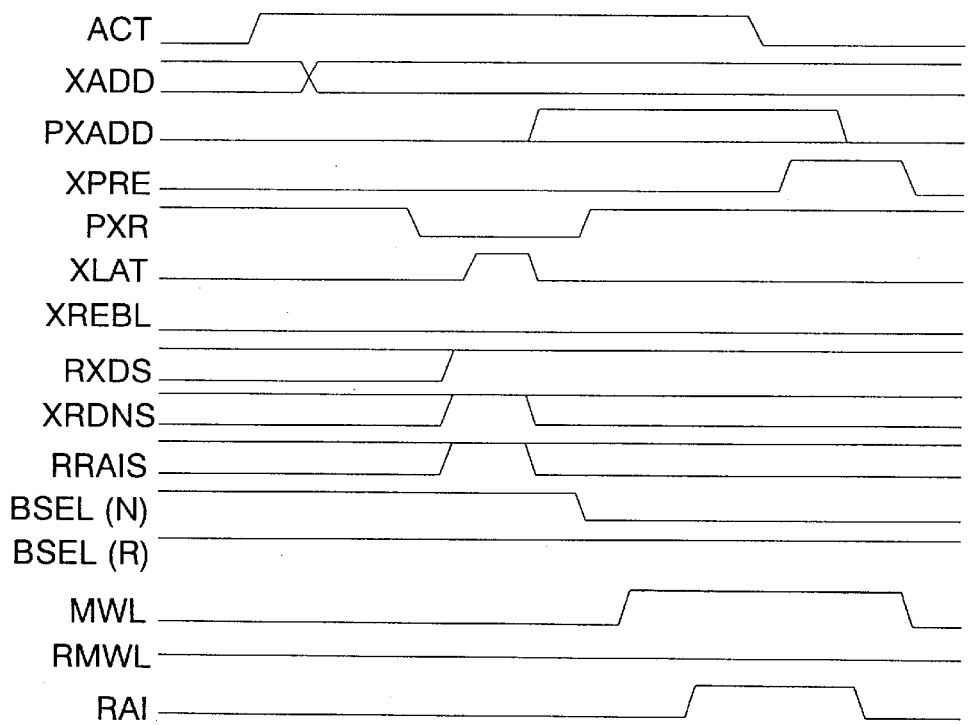
Figure 3:
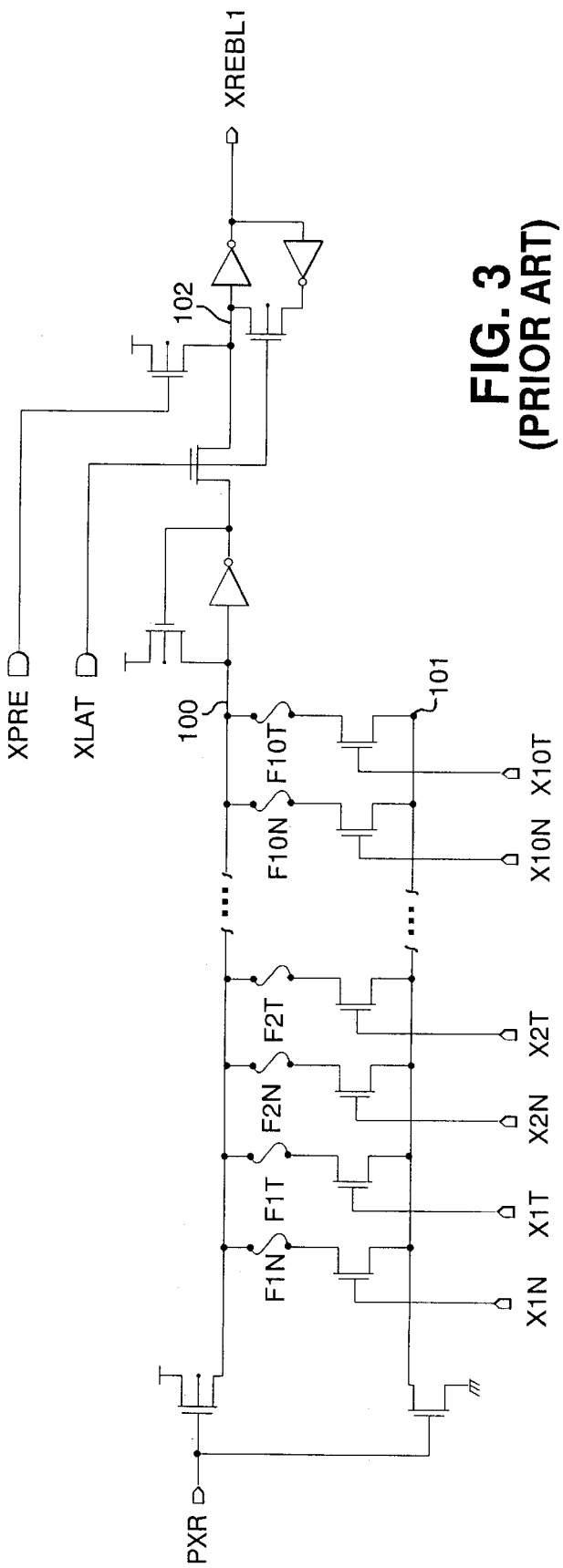
FIG. 3 is a circuit diagram showing an example of a redundant decoder XRED in FIG. 1.
Figure 5:
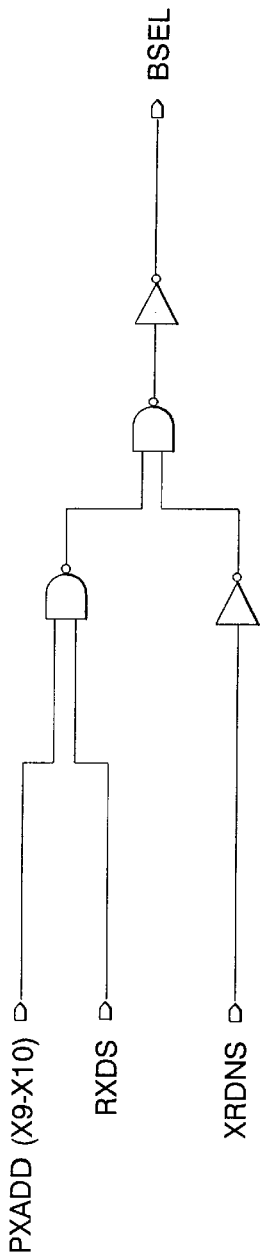
FIG. 5 is a circuit diagram showing an example of a subarray selection circuit SXC circuit in FIG. 1.
Figure 4:
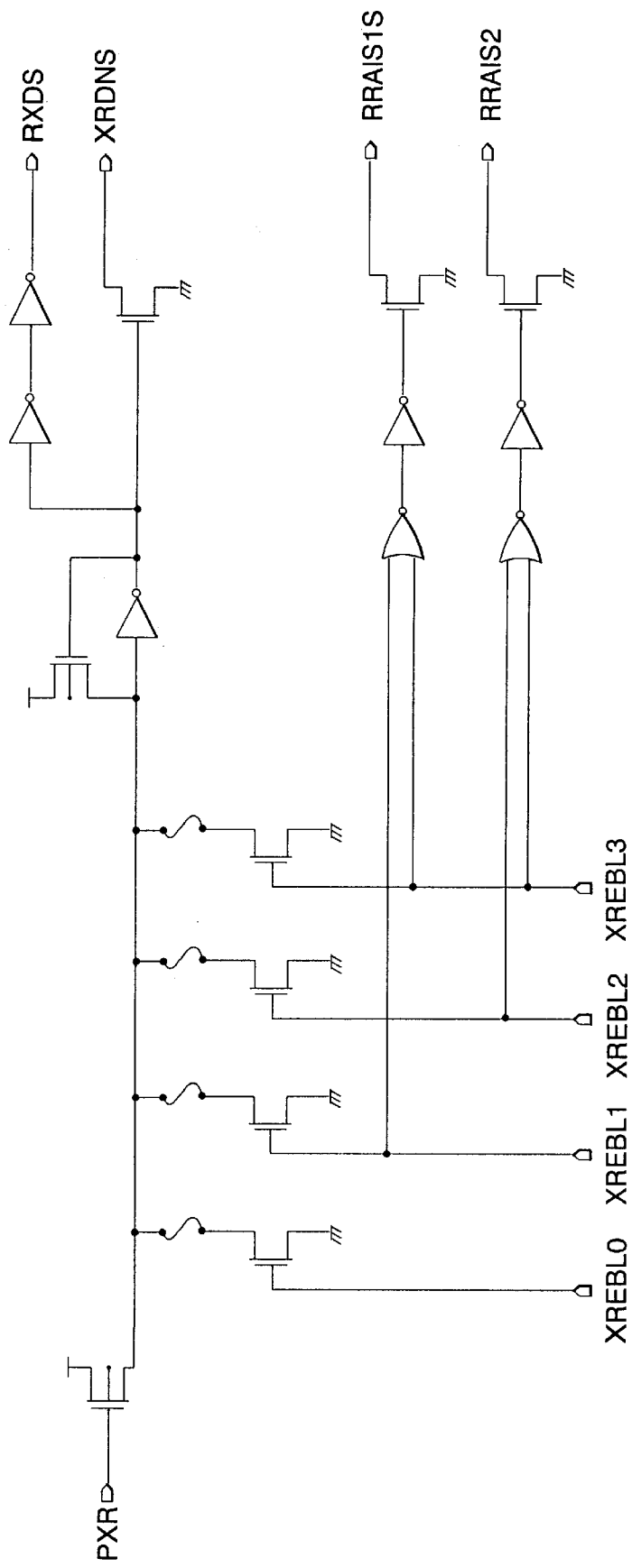
FIG. 4 is a circuit diagram showing an example of a redundant/memory cell selection circuit XRDN in FIG 1.
Figure 6:
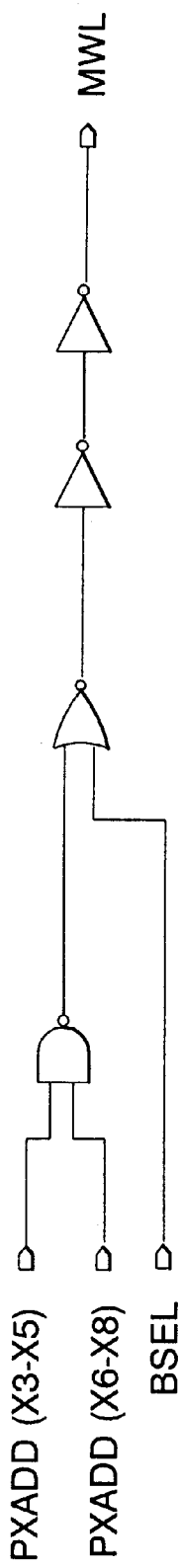
FIG. 6 is a circuit diagram showing an example of a row decoder XDEC in FIG. 1.
Figure 7:
FIG. 7 is a circuit diagram showing an example of a redundant row decoder RXDC in FIG. 1.
Figure 8:
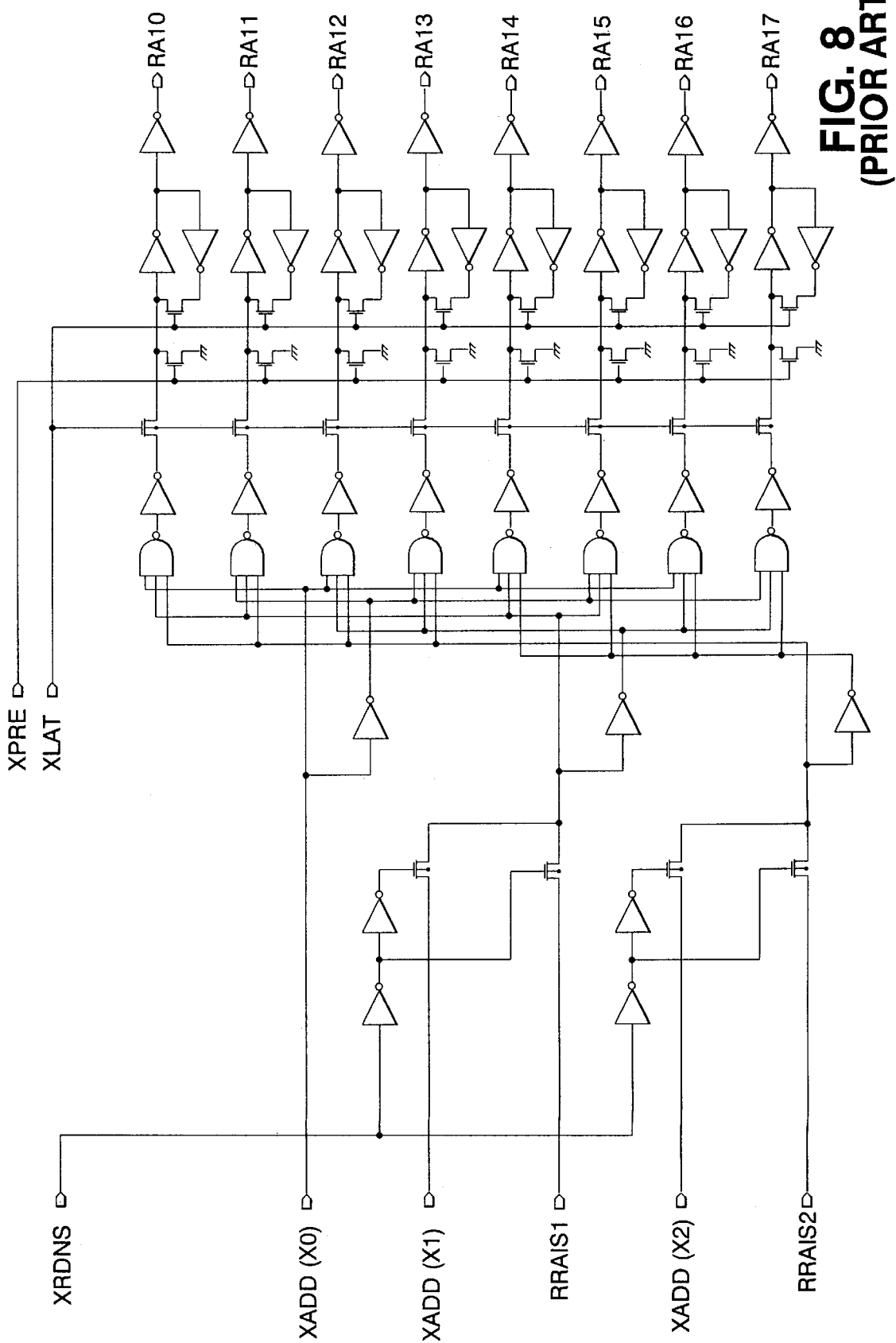
FIG. 8 is a circuit diagram showing an example of a subword line selection circuit RAIS in FIG. 1.
Figure 9:
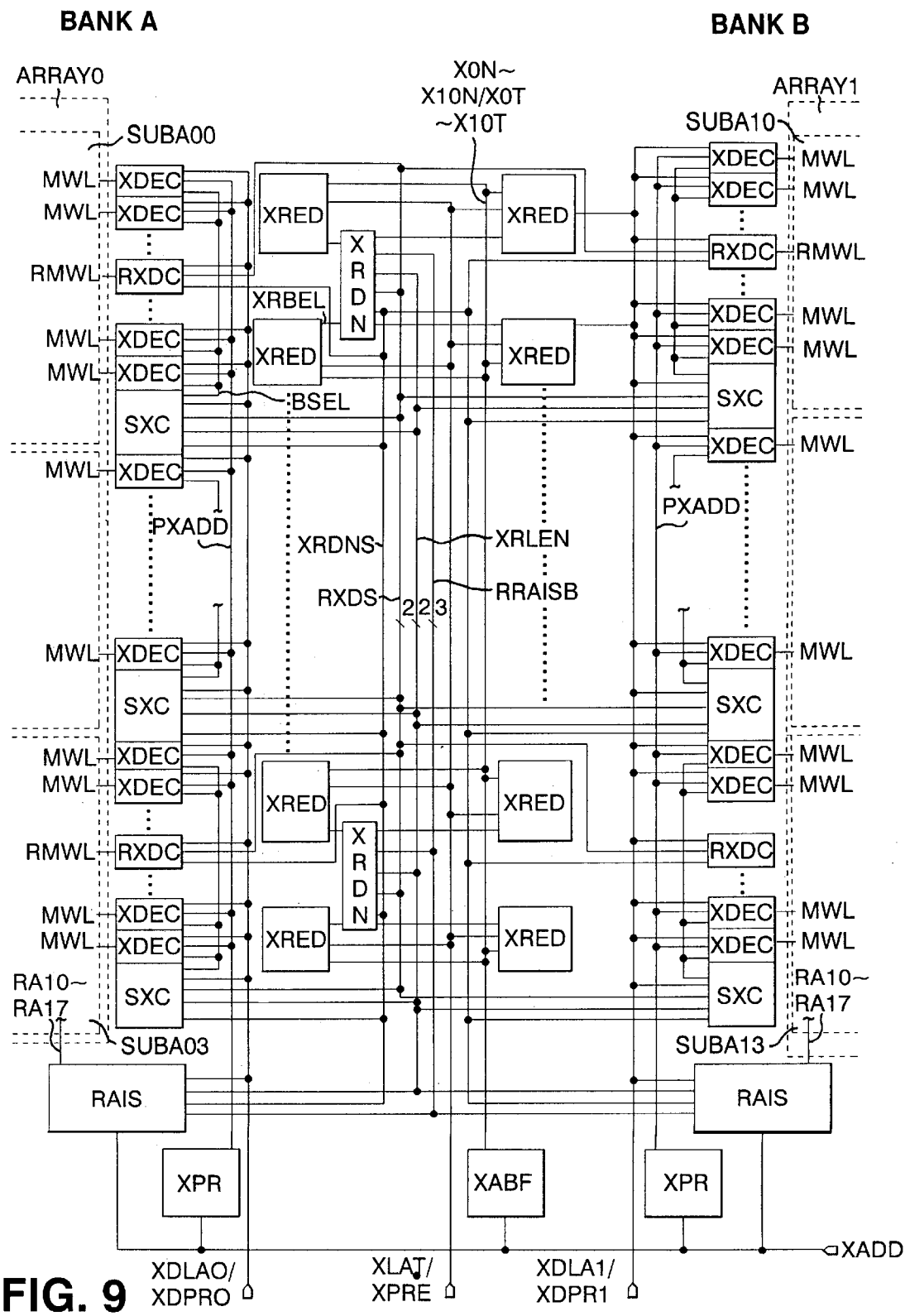
FIG. 9 is a block diagram of a semiconductor memory device according to a first embodiment of the present invention.

First Embodiment:

FIG. 9 shows a semiconductor memory device according to a first embodiment of the present invention. As shown in FIG. 9, it is assumed that the semiconductor memory device has two banks, i.e., a bank A (ARRAY0) and a bank B (ARRAY1), each comprising four subarrays (SA00–SA03, SA10–SA13), and that each subarray includes 512 subword lines (not shown). It is further assumed that the semiconductor memory device has a hierarchical word line structure, with 8 subword lines belonging to a single main word line MNWL. Therefore, each bank has an 11-bit row address (X0–X10). In the 11-bit row address, the subarrays are distinguished by bits X9, X10, the main word lines included in a subarray are distinguished by bits X3–X8, and 8 subword lines corresponding to a single main word line are distinguished by bits X0–X2.

A defective memory cell is replaced with a redundant memory cell by two row addresses distinguished by X0. Each subarray has a single redundant main word line RMWL and 8 subword lines connected thereto.

Figure 10A:
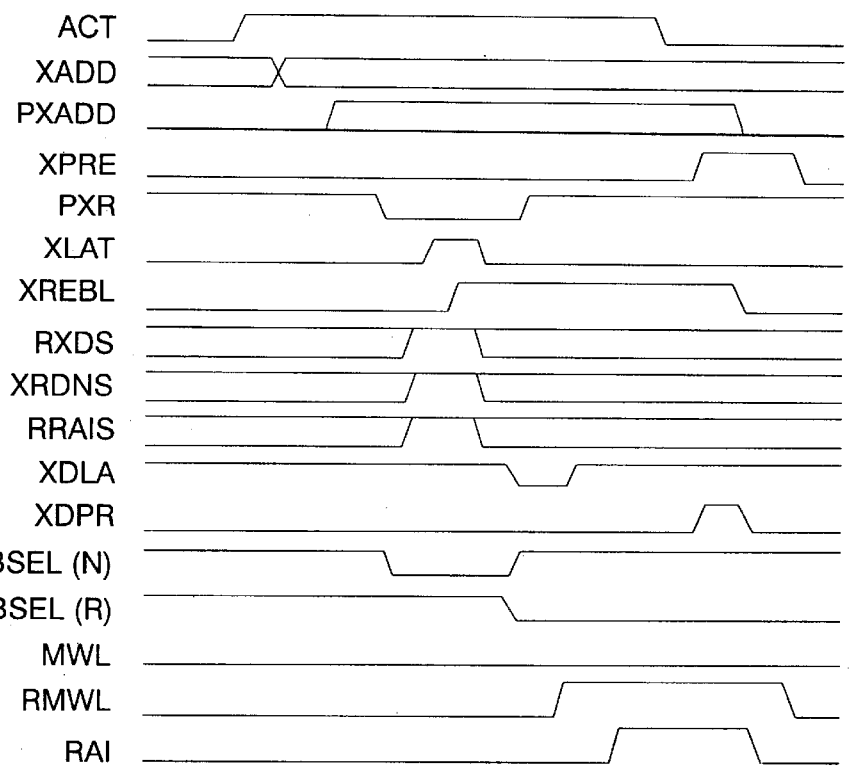
FIGS. 10A and 10B are timing charts illustrative of operation of the semiconductor memory device shown in FIG. 9 when a defective address is selected and when a defective address is not selected, respectively.
Figure 10B:
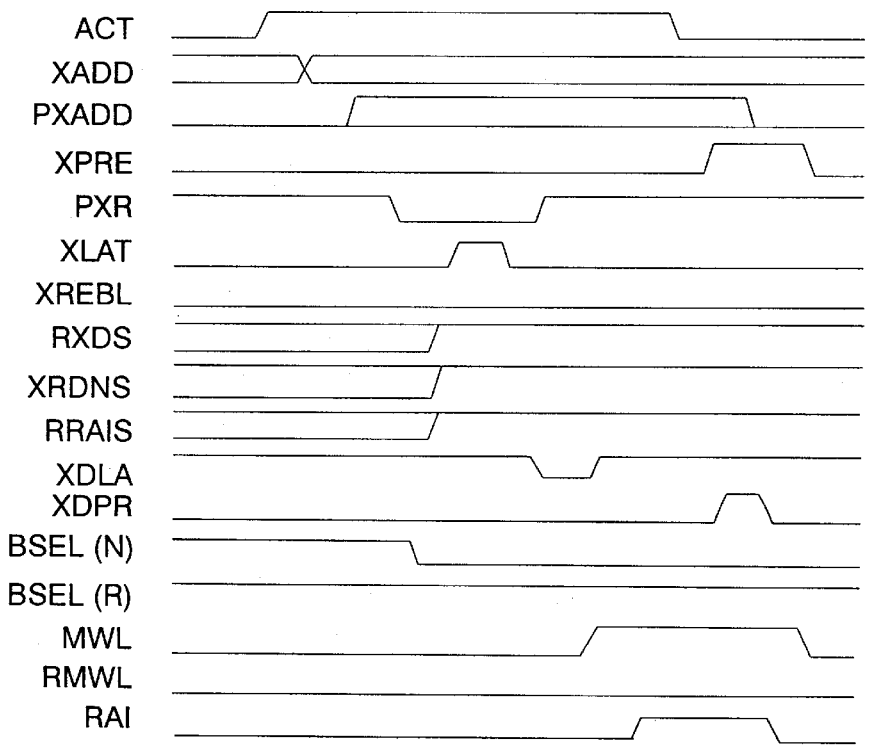

Operation of the semiconductor memory device will be described below with reference to FIGS. 9 and 10A, 10B. A row address signal XADD in the semiconductor memory device includes a row address and a bank selecting signal CBS for indicating a bank.

A row address buffer circuit XABF generates complementary signals X0N–X10N, X0T–X10T according to the row address signal XADD, and also generates complementary signals CBST, CBSN according to the bank selecting signal CBS.

Figure 11:
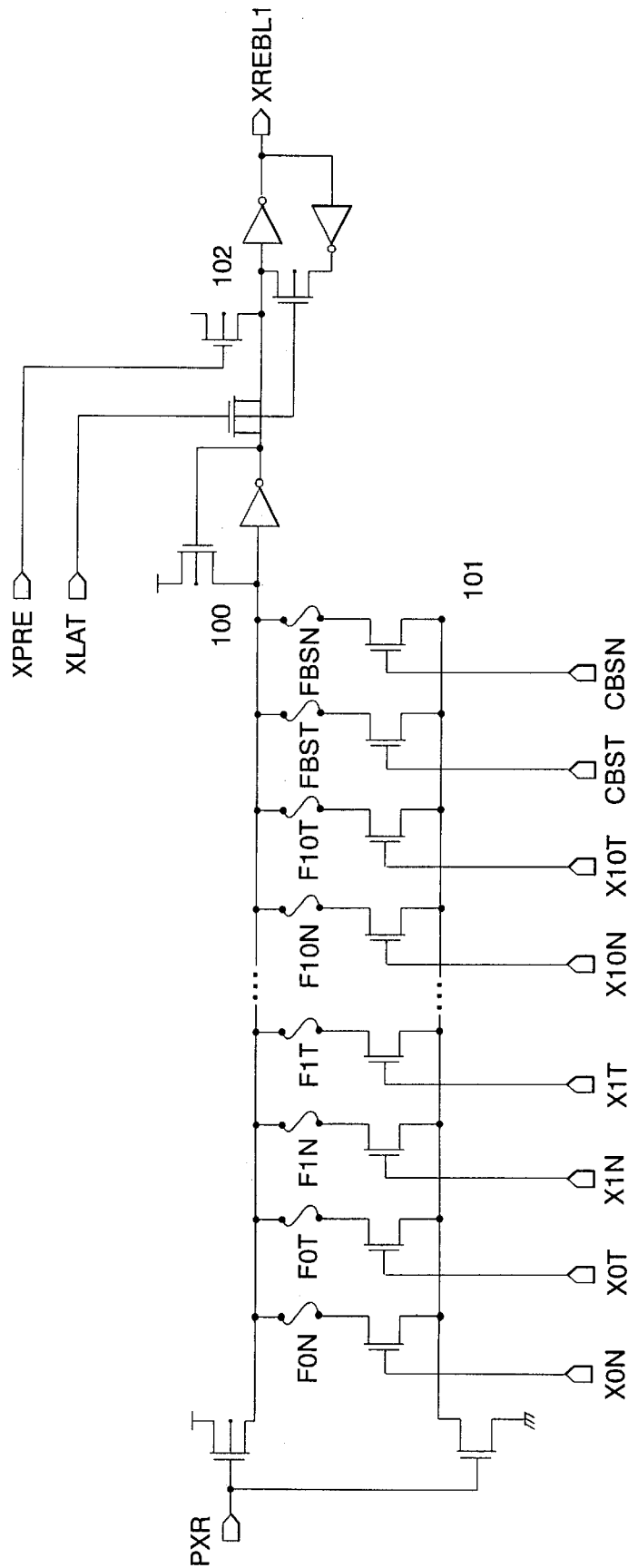
FIG. 11 is a circuit diagram of a redundancy decoder XRED in the semiconductor memory device shown in FIG. 9.

FIG. 11 shows a redundancy decoder XRED in the semiconductor memory device shown in FIG. 9. The redundancy decoder XRED has fuses FBSN, FBST for storing a bank to be replaced, unlike the conventional redundancy decoder XRED. In the redundancy decoder XRED shown in FIG. 11, nodes 100 and 101 are connected to each other unless a replacement address stored in fuses FnN, FnT agrees with the row address signal XADD and the selected bank selecting signal CBS agrees with a bank to be replaced which is stored in fuses FCBN and FCBT.

Figure 12:
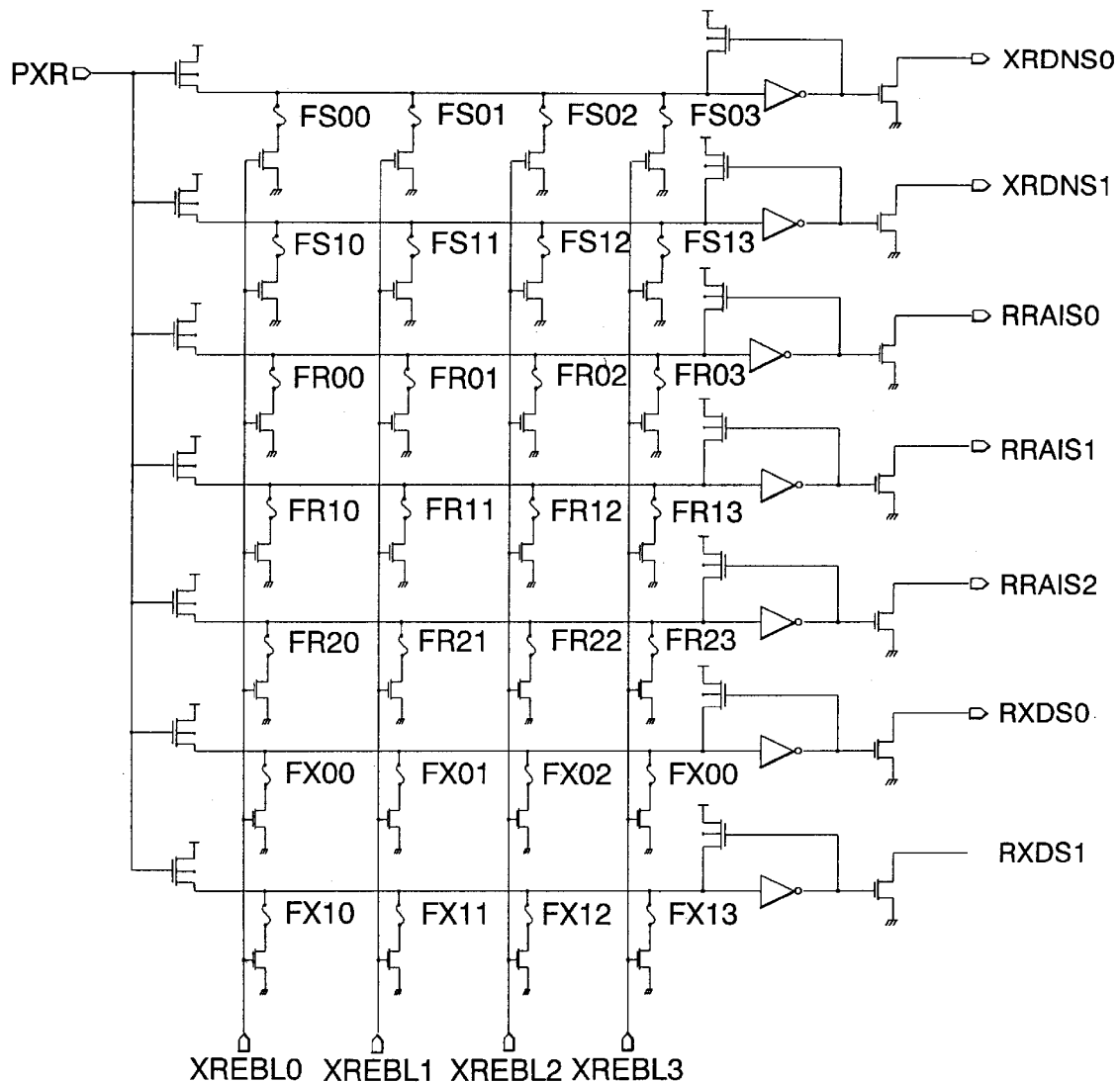
FIG. 12 is a circuit diagram of a redundant memory cell selecting circuit XRDN in the semiconductor memory device shown in FIG. 9.

FIG. 12 shows a redundant memory cell selecting circuit XRDN in the semiconductor memory device shown in FIG. 9. There is a single redundant memory cell selecting circuit XRDN for four redundancy decoders XRED. However, the number of redundancy decoders XRED to be handled by a single redundant memory cell selecting circuit XRDN is not limited to four.

When one of four defective address agreement signals XREBL that are connected becomes high in level, the redundant memory cell selecting circuit XRDN makes low a redundant replacement selecting signal XRDNS which has been made high by a precharge circuit (not shown). The redundant replacement selecting signal XRDNS is a signal indicating that a redundant memory cell has been selected.

Specifically, signals XRDNS0, XRDNS1 are normally made high by the precharge circuit (not shown), and when one of four defective address agreement signals XREBIL that are connected becomes high in level, the redundant memory cell selecting circuit XRDN selectively makes low the signals XRDNS0, XRDNS1 according to fuses FS00–FS13. The signals XRDNS0, XRDNS1 represent the number of subword lines to be replaced. When the signals XRDNS0, XRDNS1 are high and high, respectively, no redundant memory cell is selected, and no replacement is carried out. When the signals XRDNS0, XRDNS1 are low and high, respectively, a single subword line is replaced. When the signals XRDNS0, XRDNS1 are high and low, respectively, two subword lines are replaced. When the signals XRDNS0, XRDNS1 are low and low, respectively, four subword lines are replaced.

The redundant memory cell selecting circuit XRDN selectively makes low redundant row decoder selecting signals RXDS0, RXDS1 which have been made high by a precharge circuit (not shown), according to fuses FX00–FX13. The redundant row decoder selecting signals RXDS0, RXDS1 are signals for selecting a redundant main word line to be activated and a subarray which includes the redundant main word line.

Furthermore, the redundant memory cell selecting circuit XRDN selectively makes low redundant subword line selecting signals RRAIS1, RRAIS2 which have been made high by a precharge circuit (not shown), according to fuses FR0–FR1. The redundant subword line selecting signals RRAIS1, RRAIS2 are signals for selecting a subword selecting signal RAI.

Either of the signals is maintained at a high level unless agreement is achieved by a comparison in the redundancy decoder XRED.

The redundancy decoder XRED and the redundant memory cell selecting circuit XRDN operate regardless of a selected bank as banks to which they below are not fixed. Therefore, signals PXR, XLAT, XPRE, RXDS, XRDNS, PRAIS are shared between banks, and operate regardless of a bank that is activated.

FIG. 13 shows a subarray selecting circuit SXC in the semiconductor memory device shown in FIG. 9. When the row address signal XADD does not agree with all defective replacement addresses stored in all redundancy decoders XRED and the redundant row decoder selecting signals RXDS0, RXDS1 remain high, the subarray selecting circuit SXC decodes a row predecoding address signal PXADD (X9, X10), latches it with a row decoder address latch signal XDLA, activates an array of sense amplifiers (not shown) contained in the corresponding subarray, and activates a subarray selecting signal BSEL, as shown in FIG. 10B.

When the row address signal XADD agrees with the replacement address stored in either one of the redundancy decoders XRED and the redundant row decoder selecting signals RXDS0, RXDS1 become low, the subarray selecting circuit SXC decodes the redundant replacement selecting signal XRDNS, latches it with the row decoder address latch signal XDLA, and activates an array of sense amplifiers indicated by the redundant replacement selecting signal XRDNS. When the subarray indicated by the row predecoding address signal PXADD does not agree with the subarray indicated by the redundant replacement selecting signal XRDNS, the activation of a redundant main word line and an array of sense amplifiers in the subarray indicated by the row predecoding address signal PXADD is prevented.

At any rate, the array of sense amplifiers that are activated is included in the subarray including the activated word line.

FIG. 14 shows a row decoder XDEC in the semiconductor memory device shown in FIG. 9. The row decoder XDEC latches the row predecoding address signal PXADD (X3–X8) and the subarray selecting signal BSEL with the row decoder address latch signal XDLA, thereby activating the main word line. When the row address signal XADD agrees with a replacement address stored in either one of the redundancy decoders XRED and the redundant row decoder selecting signal RXDS becomes low, the main word line is prevented from being activated, as shown in FIG. 10A. When a signal ACT becomes low, all main word lines MWL are made unselected by a row decoder precharge signal XDPR, as shown in FIG. 10B.

Figure 15:
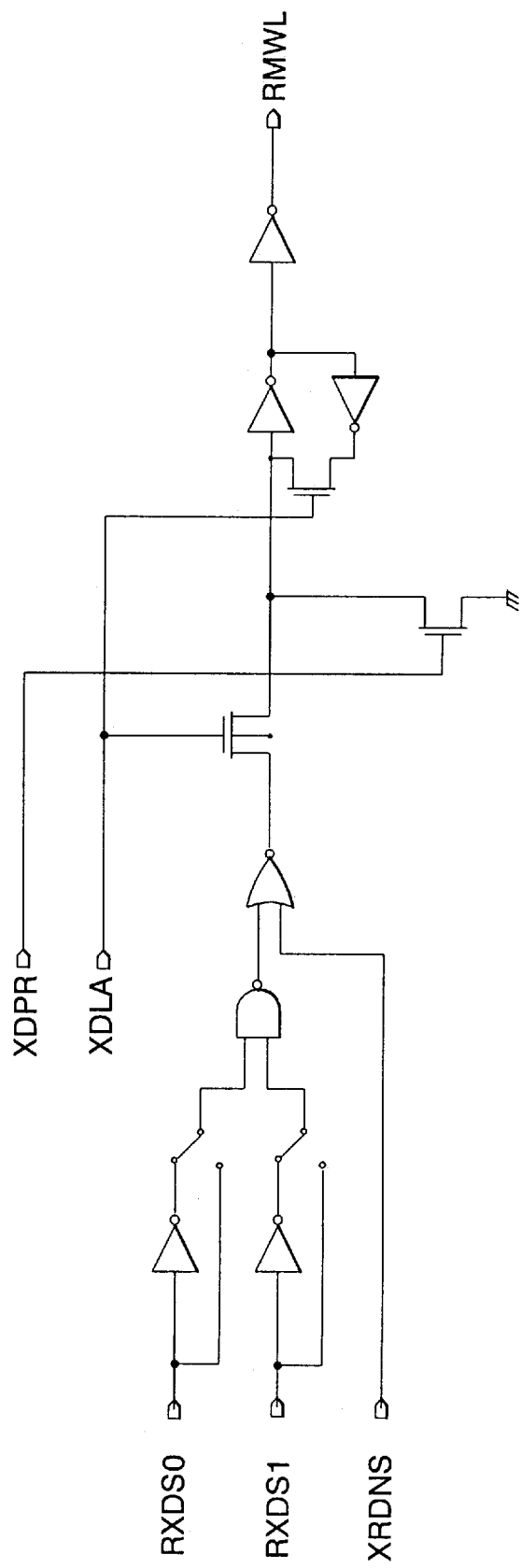
FIG. 15 is a circuit diagram of a redundant row decoder RXDC in the semiconductor memory device shown in FIG. 9.

FIG. 15 shows a redundant row decoder RXDC in the semiconductor memory device shown in FIG. 9. When the row address signal XADD agrees with a replacement address stored in either one of the redundancy decoders XRED and the redundant row decoder selecting signal RXDS becomes low, the redundant row decoder RXDC activates a redundant main word line based on the redundant replacement selecting signal XRDNS, as shown in FIG. 10A. When the signal ACT becomes low, all redundant main word lines RMWL are made unselected by the row decoder precharge signal XDPR, as shown in FIG. 10B.

Figure 16:
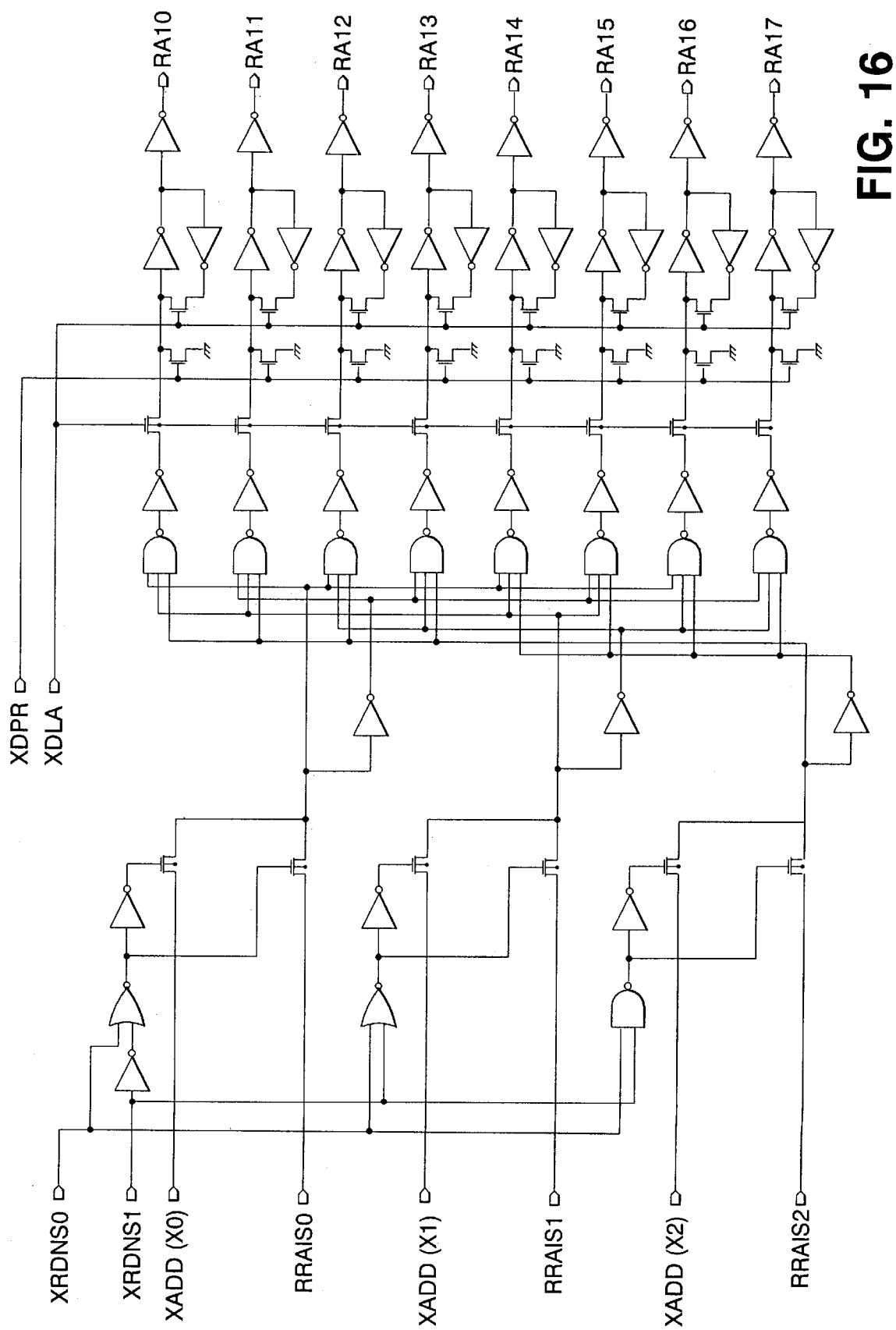
FIG. 16 is a circuit diagram of a subword line selecting circuit RAIS in the semiconductor memory device shown in FIG. 9.

FIG. 16 shows a subword line selecting circuit RAIS in the semiconductor memory device shown in FIG. 9. The subword line selecting circuit RAIS selects a subword line selecting signal RAI according to row address predecoding signals PXADD, PRAIS and a redundant row decoder selecting signal. When the row address signal XADD does not agree with a defecting replacement address in any of the redundancy decoders XRED and the redundant row decoder selecting signal RXDS is high, the subword line selecting circuit RAIS activates only one of subword line selecting signals RAI0–RAI7 according to the row address signal XADD (X0–X2). When the row address signal XADD agrees with a defecting replacement address in either one of the redundancy decoders XRED and at least one of the redundant row decoder selecting signals RXDS0, RXDS1 is low, the subword line selecting circuit RAIS activates the redundant subword line selecting signal PRAIS.

When only the signal XRDNS0 is low (for replacing one subword line), a signal PRAIS0 is selected in place of X0 of the row address signals XADD, a signal RRAIS1 is selected in place of X1 of the row address signals XADD, and one of RAI0–RAI7 of a signal RRAIS2 is selected in place of X2 of the row address signals XADD.

When only the signal XRDNS1 is low (for replacing two subword lines), the signal RRAIS1 is selected in place of X1 of the row address signals XADD, the signal RRAIS2 is selected in place of X2 of the row address signals XADD, and one of RAI0–RAI7 is selected with X0 of the row address signals XADD.

When both the signals XRDNS0, XRDNS1 are low (for replacing four subword lines), the signal RRAIS2 is selected in place of X2 of the row address signals XADD, and one of RAI0–RAI7 is selected with X0, X1 of the row address signals XADD. These results are latched by the row decoder address latch signal XDLA. When the signal ACT becomes low, all signals RAI are made unselected by the row decoder precharge signal XDPR.

The main word line MWL and the subword selecting signal RAI are inputted to a subword line driver circuit (not shown), and ANDed to select a subword line SWL. The subword line SWL is directly connected to a memory cell to activate same.

When the signal ACT becomes low, all main word lines MWL or redundant main word lines RMWL and the subword selecting signal RAI are made unselected by the row decoder precharge signal XDPR, so that the subword line SWL is inactivated.

In the semiconductor memory device according to the first embodiment, which bank's replacement address is to be stored and compared by each of the redundancy decoders XRED is determined by a program generated by cutting off fuses.

There are four redundant main word lines per bank and corresponding 32 subword lines. There are 32 redundancy decoders XRED with respect to two banks. Therefore, if all redundancy decoders XRED are used with respect to the bank A and each replacement is limited to one address (corresponding to a single bit defect and a defect such as a subword line disconnection), then a maximum of 32 defects within the bank can be repaired. Consequently, the efficiency with which to repair defects is increased in the case where the occurrence of defects is unevenly distributed between the banks.

A subword line having four addresses which share addresses other than X0, X1 can be replaced by only one redundancy decoder XRED. Therefore, if a main word line (corresponding to 8 subword lines sharing other than X0–X2), for example, becomes defective, then the 8 subword lines are replaced using two redundancy decoders XRED. If 8 redundancy decoders XRED are used, then four main word lines (32 subword lines) per bank can be repaired. Since only four redundant main word lines are present per bank, no more main word lines can be repaired with respect to the bank A, but a maximum of 24 defects can be repaired with respect to the bank B using remaining 24 redundancy decoders XRED. Consequently, even when one defect is composed of a plurality of successive defective address, the efficiency with which to repair the defect is increased.

In the semiconductor memory device according to the first embodiment, as described above, redundancy decoders XRED can be used to replace defective memory cells in both the banks A, B, unlike the conventional semiconductor memory device, and hence redundant memory cells present in each bank can efficiently be used. Even if defects are localized in a certain bank, the probability that these defects can be repaired is higher than with the conventional semiconductor memory device though the same number of redundancy decoders XRED and the same number of redundant memory cells are involved. Accordingly, it is possible to achieve an increased yield of semiconductor memory devices without causing a substantial increase in the chip area.

Figure 17:
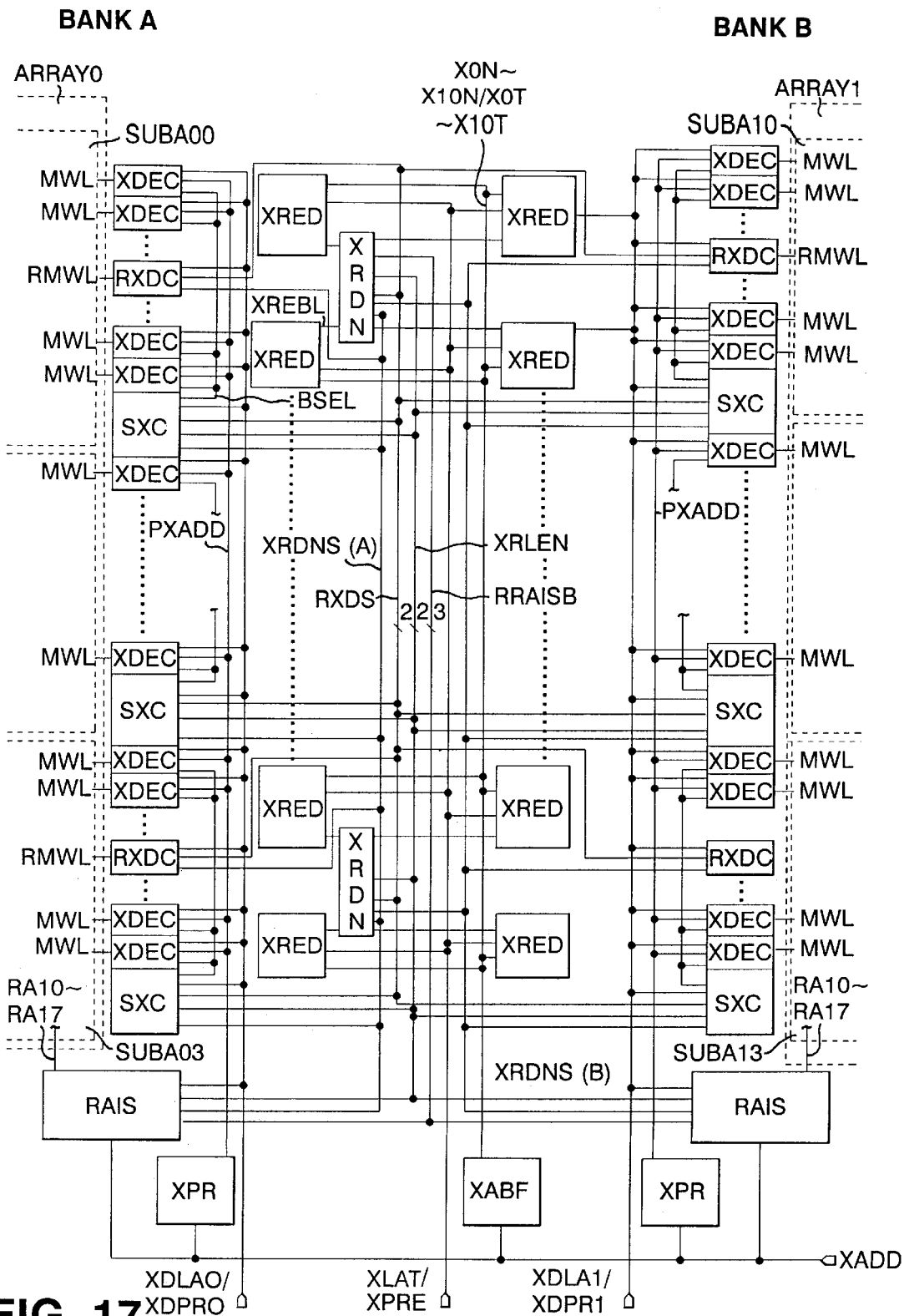
FIG. 17 is a block diagram showing a configuration of a semiconductor memory device according to a second embodiment of the present invention.

Second Embodiment:

Redundant memory cell selecting circuit XRDN in the semiconductor memory device according to the first embodiment shown in FIG. 9 outputs only redundant replacement selecting signal XRDNS indicating that the redundant memory cell has been selected when the replacement is performed by the redundant memory cell. Whereas, redundant memory cell selection circuit XRDN in a semiconductor memory device according to the second embodiment of the present invention, as shown in FIG. 17, is designed to output redundant replacement selection signal XRDNS(A) indicating that the redundant memory cell in bank A has been selected, and redundant replacement selection signal XRDNS(B) indicating that the redundant memory cell in bank B has been selected. Redundant replacement selection signal XRDNS(A) is applied to redundant row decoder RXDC, subarray selection circuit SXC, and subword line selection circuit RAIS, all of which are provided in bank A, while redundant replacement selection signal XRDNS(B) is applied to redundant row decoder RXDC, subarray selection circuit SXC, and subword line selection circuit RAIS, all of which are provided in bank B.

Figure 18:
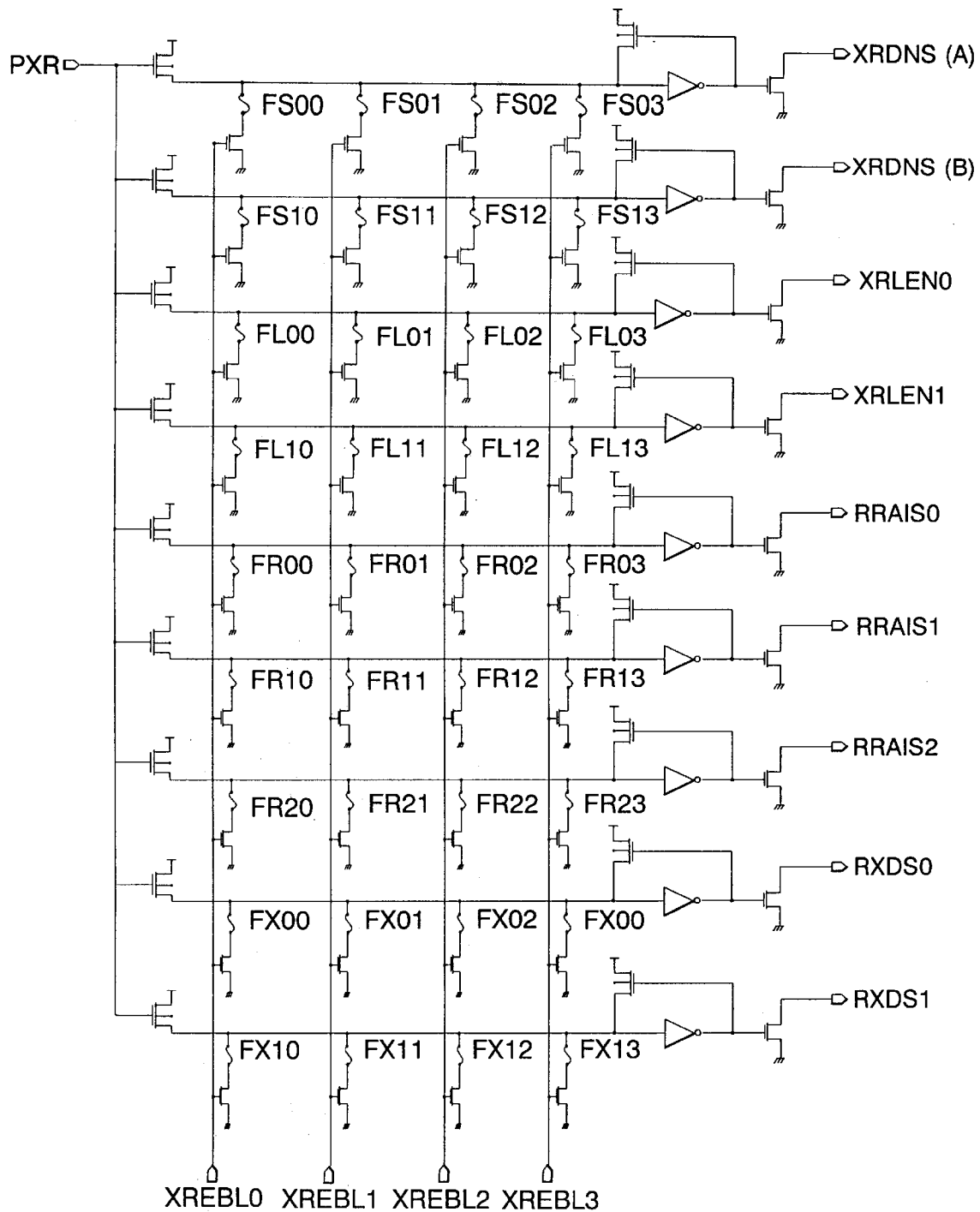
FIG. 18 is a circuit diagram of a redundant memory cell selection circuit XRDN in FIG. 17.

With reference to FIG. 18, in the redundant memory cell selection circuit XRDN, when defective address match signals XREBL0 to 3 go to a high level, redundant replacement selection signal XRDNS(A) goes to a low level if the corresponding fuses within fuses FS00 to FS03 are not cut. Also, when defective address match signals XREBL0 to 3 similarly go to a high level, redundant replacement selection signal XRDNS(B) goes to a low level if the corresponding fuses within fuses FS10 to FS13 are not cut.

Row address signal buffer XABF in the semiconductor memory device of the present embodiment is designed to determine that the device is in refreshing, set both complementary signals CBST, CBSN to a low level, and outputs these signals when bank selection signal CBS of upper bits in row address signal XADD is not applied.

Thus, in refreshing, defective address match signal XREBL is outputted only if the row address matches the address stored in the redundant decoder XRED, regardless of which bank A or B redundant decoder XRED is assigned to. In redundant memory cell selection circuit XRDN, fuses are set such that redundant replacement selection signal XRDNS is supplied to the same bank as the bank to which redundant decoder XRED having outputted defective address match signal XREBL applied to redundant memory cell selection circuit XRDN is assigned.

For example, when defective address match signal XREBL outputted from redundant decoder XRED for bank A is applied to a redundant memory cell selection circuit XRDN, only redundant replacement selection signal XRDNS(A) is outputted and redundant replacement selection signal XRDNS(B) is not outputted. Thus, the replacement is performed in bank A by the redundant memory cell, while the replacement is not performed in bank B.

In this way, in the semiconductor memory device of the present invention, only the bank to be replaced can be actually replaced even in refreshing where no bank selection signal CSA in row address signal XADD is present.

FIGS. 19 to 22 are timing charts showing the operation of the second embodiment. The operations of the signals other than redundant replacement selection signals XRDNA(A), XRDNS(B) in these timing charts are similar to those in FIGS. 10A and 10B, and the description thereof is omitted.

Figure 19:
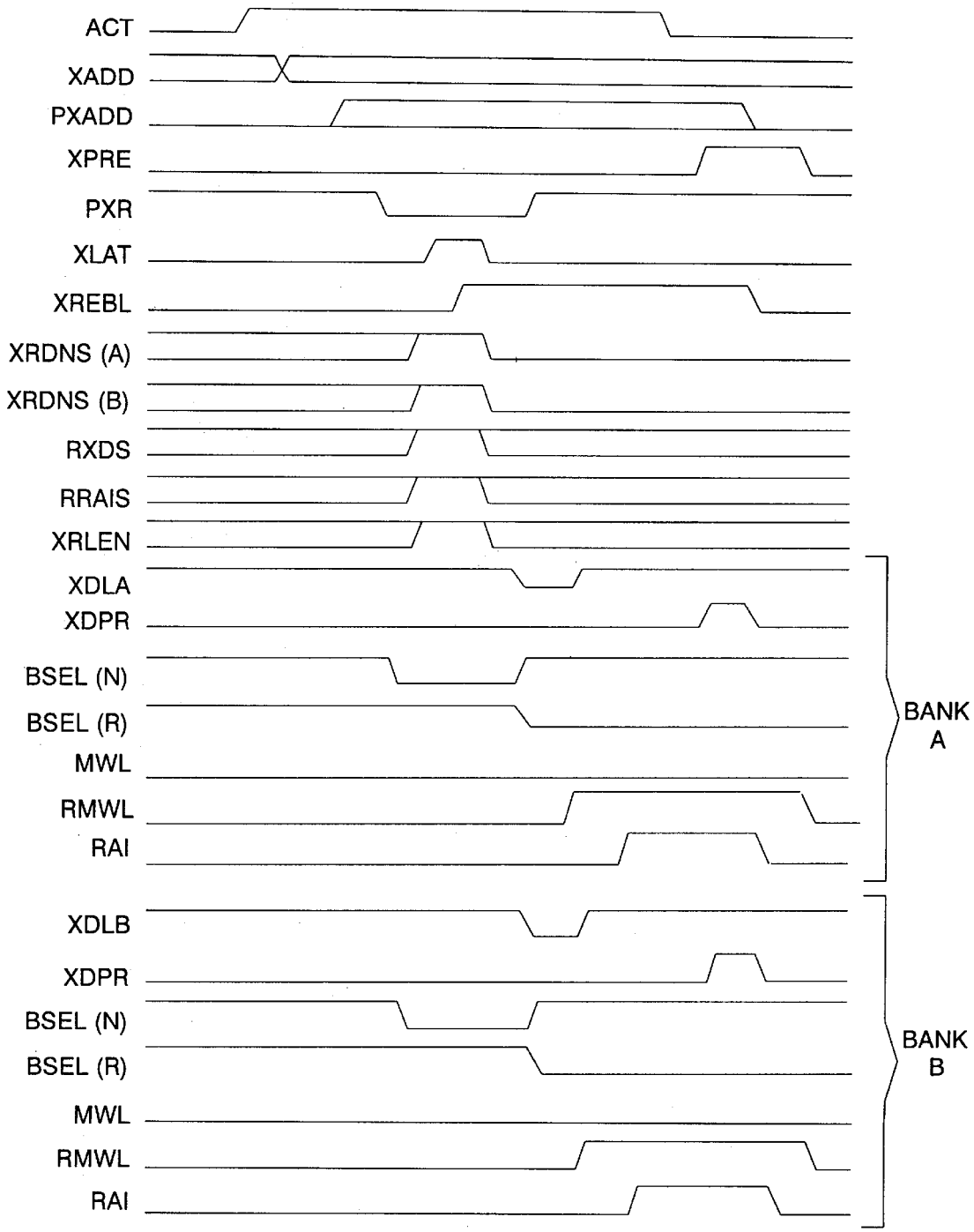
FIG. 19 is a timing chart showing the operation in refreshing when the replacement is performed in both banks A, B.

FIG. 19 is a timing chart showing the operation in refreshing when the replacement is performed in both banks A, B.

In this case, both redundant replacement selection signals XRDNS(A), XRDNS(B), after once precharged and going to a high level, goes to a low level, i.e. active through defective address match signal XREBL. Thus, redundant main word lines RMWL are activated instead of main word lines MWL in both banks A, B.

Figure 20:
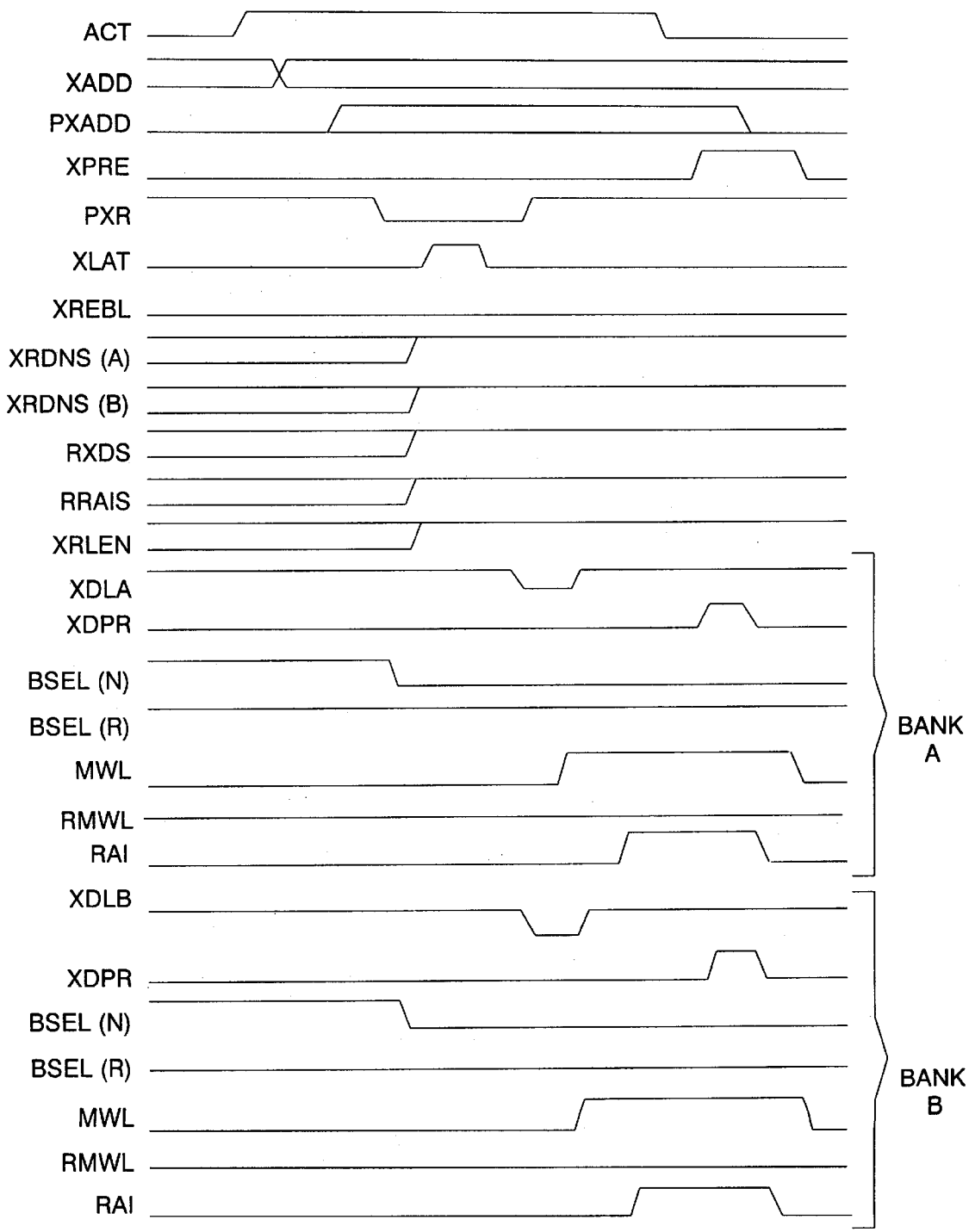
FIG. 20 is a timing chart showing the operation in refreshing when the replacement is not performed in either of banks A, B.

FIG. 20 is a timing chart showing the operation in refreshing when the replacement is not performed in either bank A or B.

In this case, both redundant replacement selection signals XRDNS(A), XRDNS(B), after once precharged and going to a high level, remain at the high level, i.e. inactive. Therefore, main word lines MWL are activated and redundant main word lines RMWL are not activated in either bank A or B.

Figure 21:
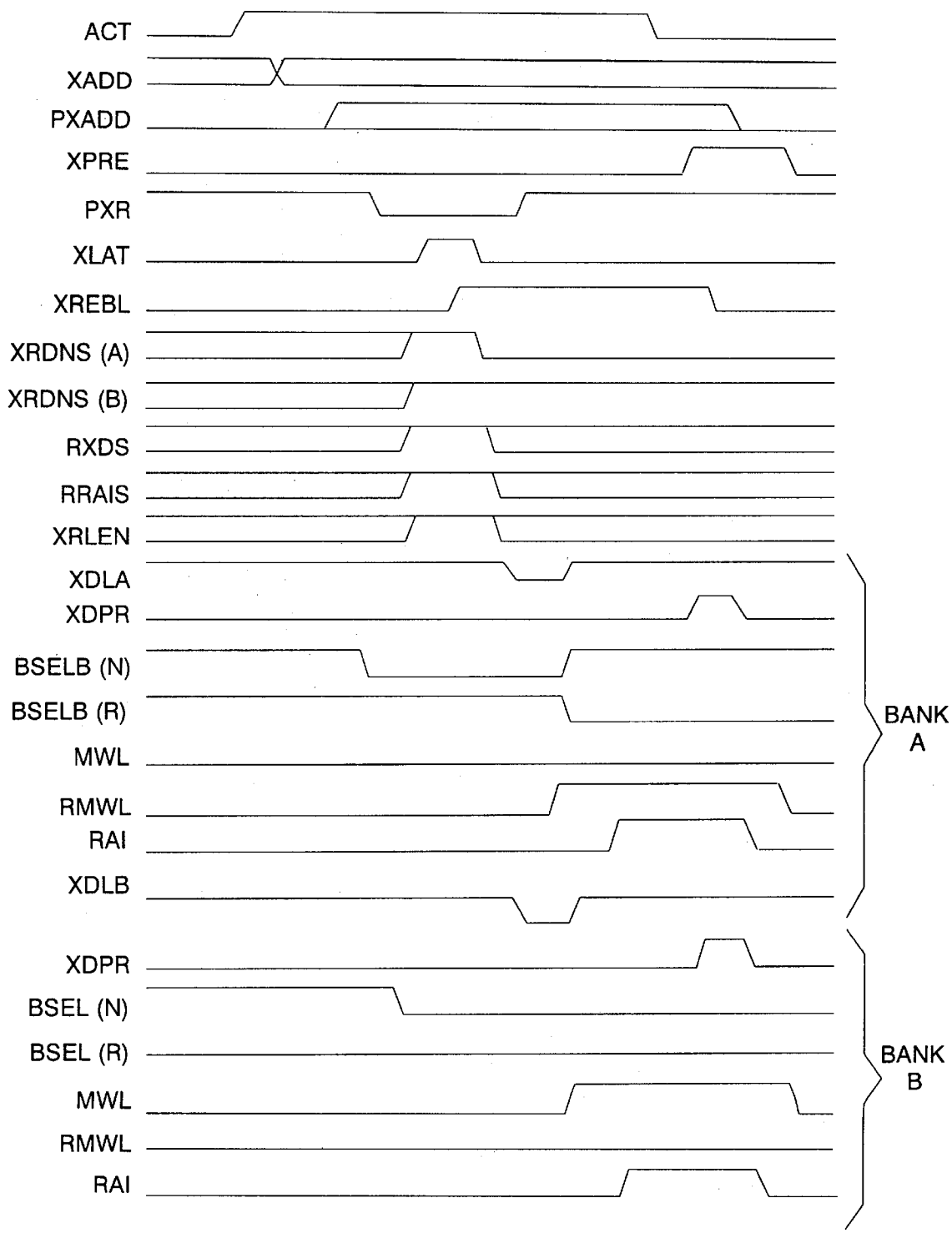
FIG. 21 is a timing chart showing the operation in refreshing when the replacement is performed only in bank A.

FIG. 21 is a timing chart showing the operation in refreshing when the replacement is performed only in bank A.

In this case, redundant replacement selection signal XRDNS(A), after once precharged and going to a high level, goes to a low level, i.e. active by defective address match signal XREBL. However, redundant replacement selection signal XRDNS(B), after once precharged and going to a high level, remains at the high level, i.e. inactive. Therefore, redundant main word RMWL is activated in bank A, while main word line MEL is activated in bank B.

Figure 22:
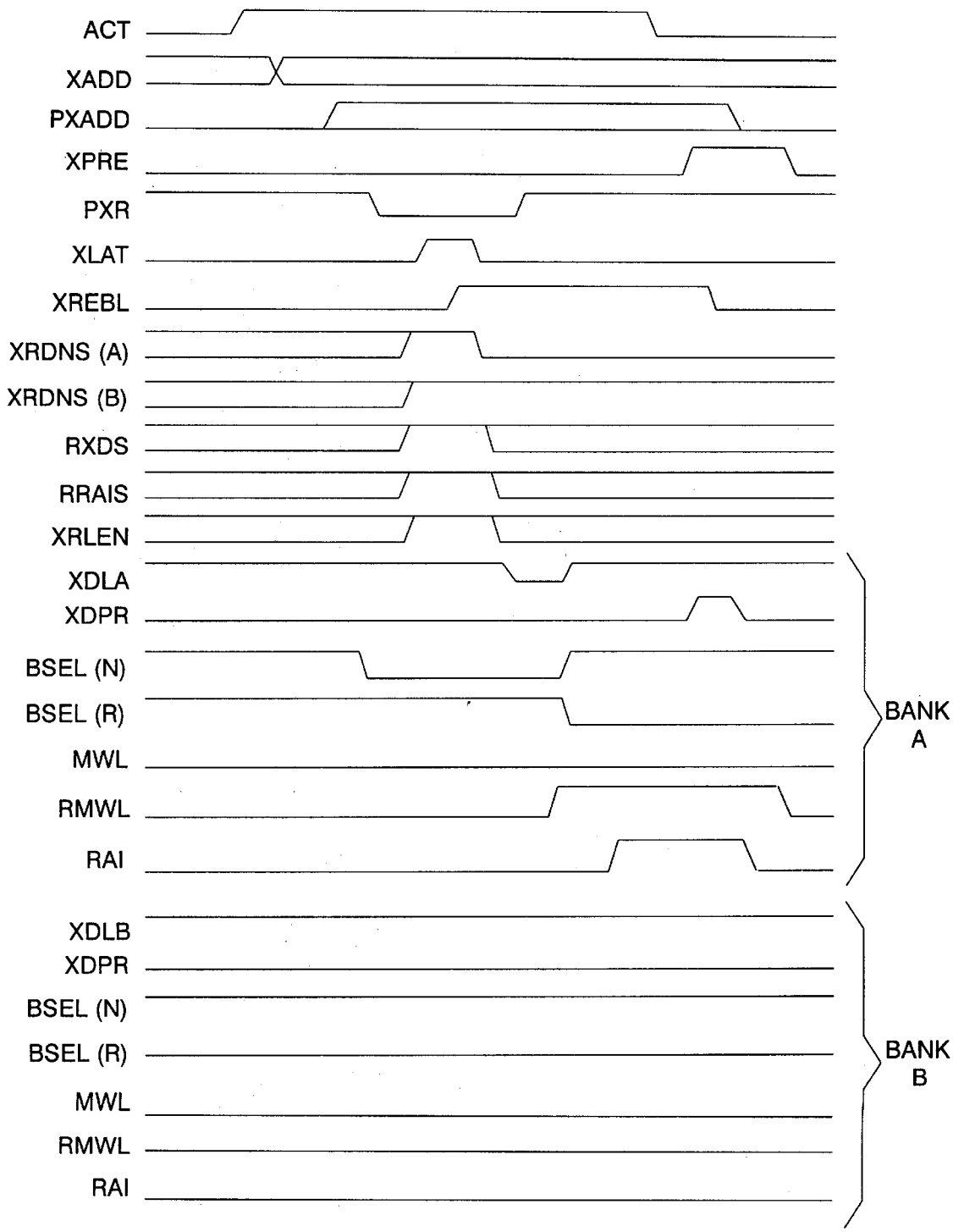
FIG. 22 is a timing chart showing the operation in reading/writing when the replacement is performed only in bank A.

FIG. 22 is a timing chart showing the operation in reading/writing when the replacement is performed only in bank A.

In this case, redundant replacement selection signal XRDNS(A), after once precharged and going to a high level, goes to a low level, i.e. active by defective address match signal XREBL. However, redundant replacement selection signal XRDNS(B), once precharged and going to a high level, remain at the high level, i.e. inactive. Therefore, redundant main word line RMWL is activated in bank A. However, in this case, bank B itself is not activated, so that all the signals for bank B are in an inactive state.

In the semiconductor memory device according to the present invention, even when both banks are simultaneously activated for performing refreshing, redundant replacement selection signals XRDNS(A), (B) are respectively provided for respective banks to allow the selection of the bank to be replaced, thereby avoiding a problem that the memory cell requiring no replacement is replaced. Accordingly, even in reading/writing and in refreshing, memory cells which belong to different banks and are to be simultaneously activated can be replaced by the redundant decoder in common among the banks. Thus, the replacement efficiency in the redundant memory cell is increased and the yield for the semiconductor memory device can be improved.

It should be noted that, although the present embodiment has given an example of the replacement of defective memory cells with the redundant memory cells in accordance with row addresses, the semiconductor memory device can be modified so as to meet the spirit of the present invention similarly for the replacement of defective memory cells with the redundant memory cells in accordance with column addresses.

Additionally, although in the present invention, redundant decoder XRED stores addresses of defective memory cells to be replaced, in accordance with the presence or absence of the cut of fuses, the present invention is not limited to this. The present invention can be applied any memory means as long as it is a nonvolatile memory means capable of storing addresses even when the power supply is turned off.

Figure 23:
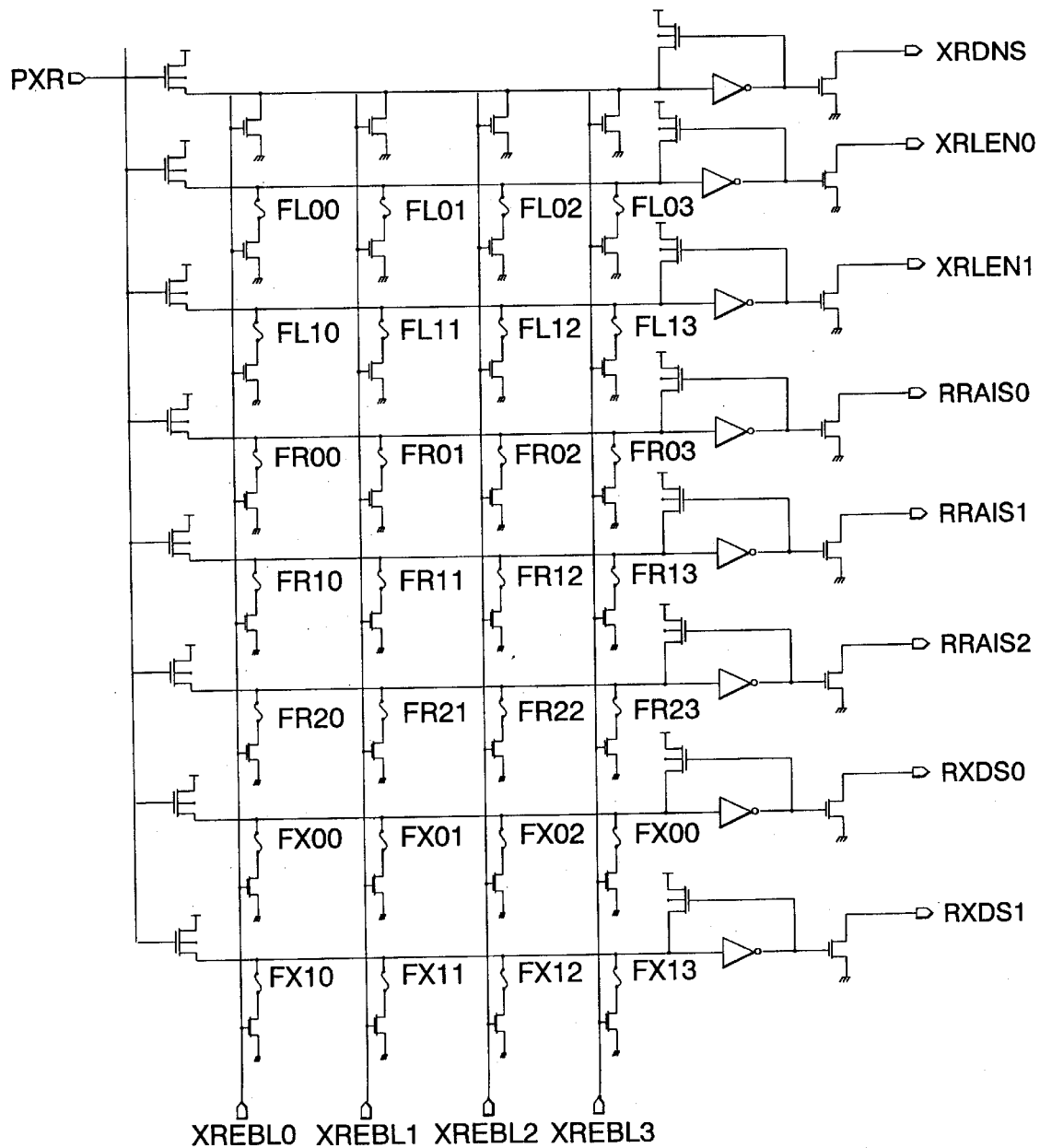
FIG. 23 is a circuit diagram of a redundant memory cell selecting circuit XRDN in a semiconductor memory device according to a third embodiment of the present invention.
Figure 24:
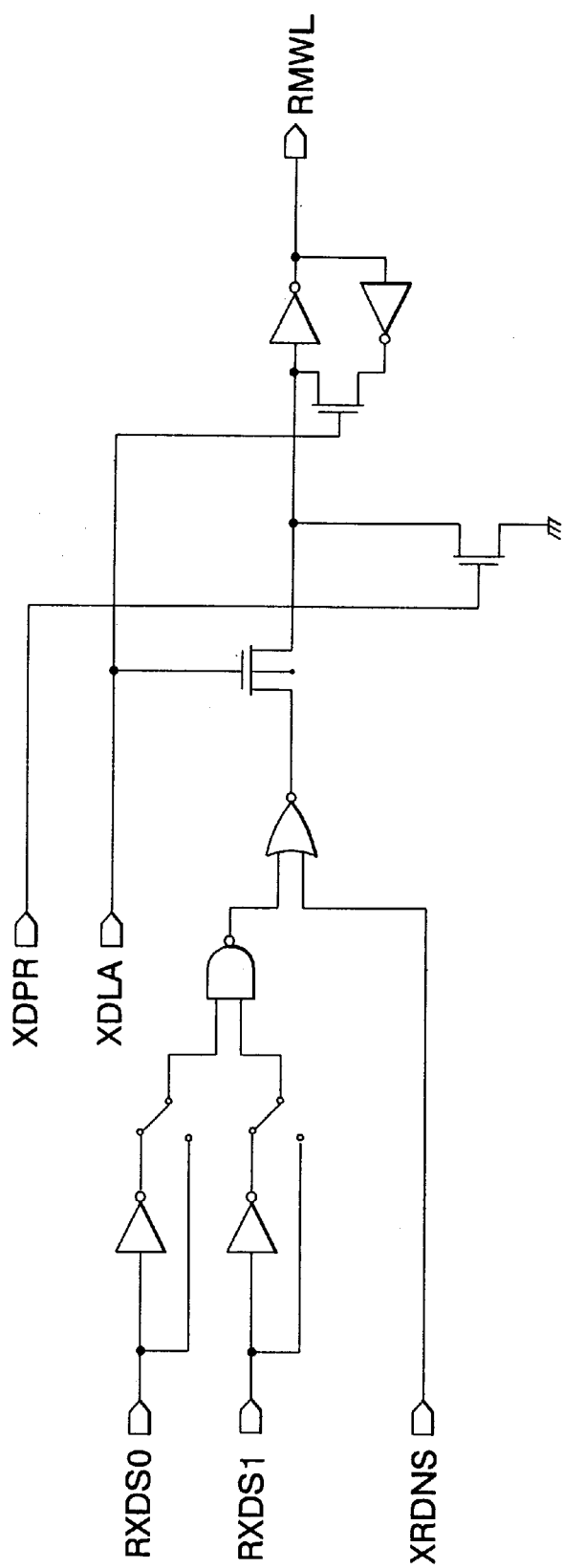
FIG. 24 is a circuit diagram of a redundant row decoder RXDC in the semiconductor memory device according to the third embodiment.
Figure 25:
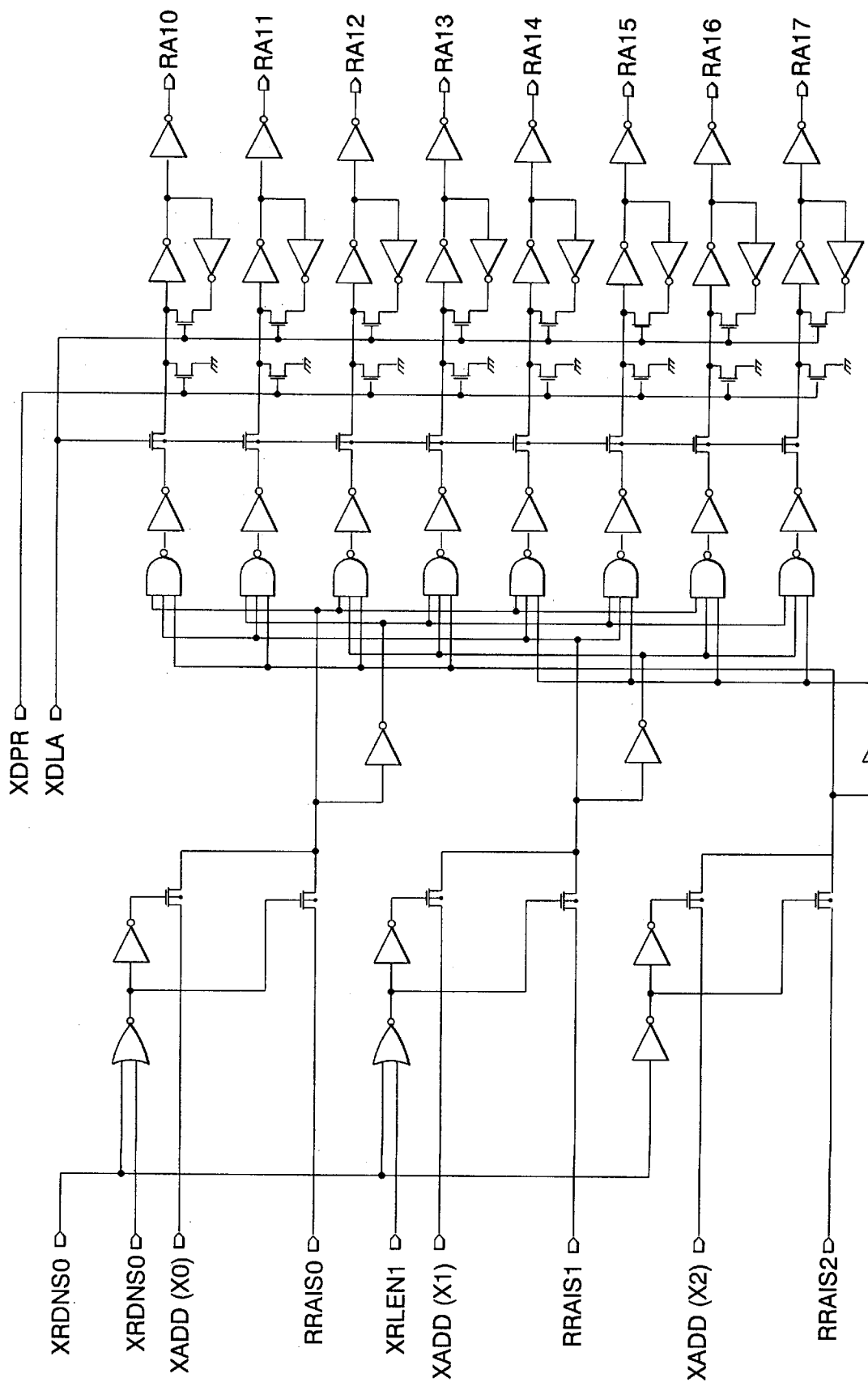
FIG. 25 is a circuit diagram of a subword line selecting circuit RAIS in the semiconductor memory device according to the third embodiment.

Third Embodiment:

FIG. 23 shows a redundant memory cell selecting circuit XRDN in a semiconductor memory device according to a third embodiment of the present invention. FIG. 24 shows a redundant row decoder RXDC in the semiconductor memory device according to the third embodiment. FIG. 25 shows a subword line selecting circuit RAIS in the semiconductor memory device according to the third embodiment.

In the first embodiment, the signals XRDNS0, XRDNS1 indicating that a redundant memory cell has been selected are also indicative of the number of subword lines to be replaced. In the third embodiment, these two indicating functions are separated, and a signal XRDNS indicates that a redundant memory cell has been selected, whereas signals XRLEN0, XRLEN1 are indicative of the number of subword lines to be replaced. When the signals XRLEN0, XRLEN1 are low and low, respectively, a single subword line is replaced. When the signals XRLEN0, XRLEN1 are high and low, respectively, two subword lines are replaced. When the signals XRLEN0, XRLEN1 are low and high, respectively, four subword lines are replaced. The third embodiment offers the same advantages as the first embodiment, and is additionally advantageous in that the circuit is simplified because only the signal XRDNS needs to be referred to for determining that a redundant memory cell has been selected in the redundant row decoder RXDC.

Figure 26:
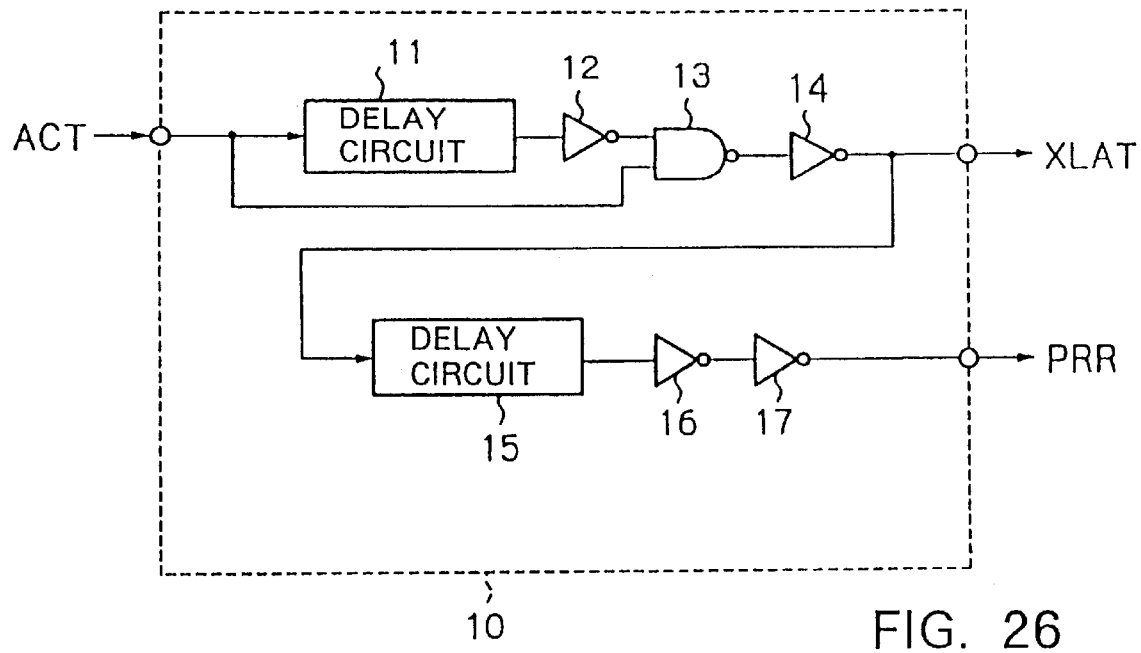
FIG. 26 is a block diagram of a timing control circuit in a semiconductor memory device according to a fourth embodiment of the present invention.
Figure 27:
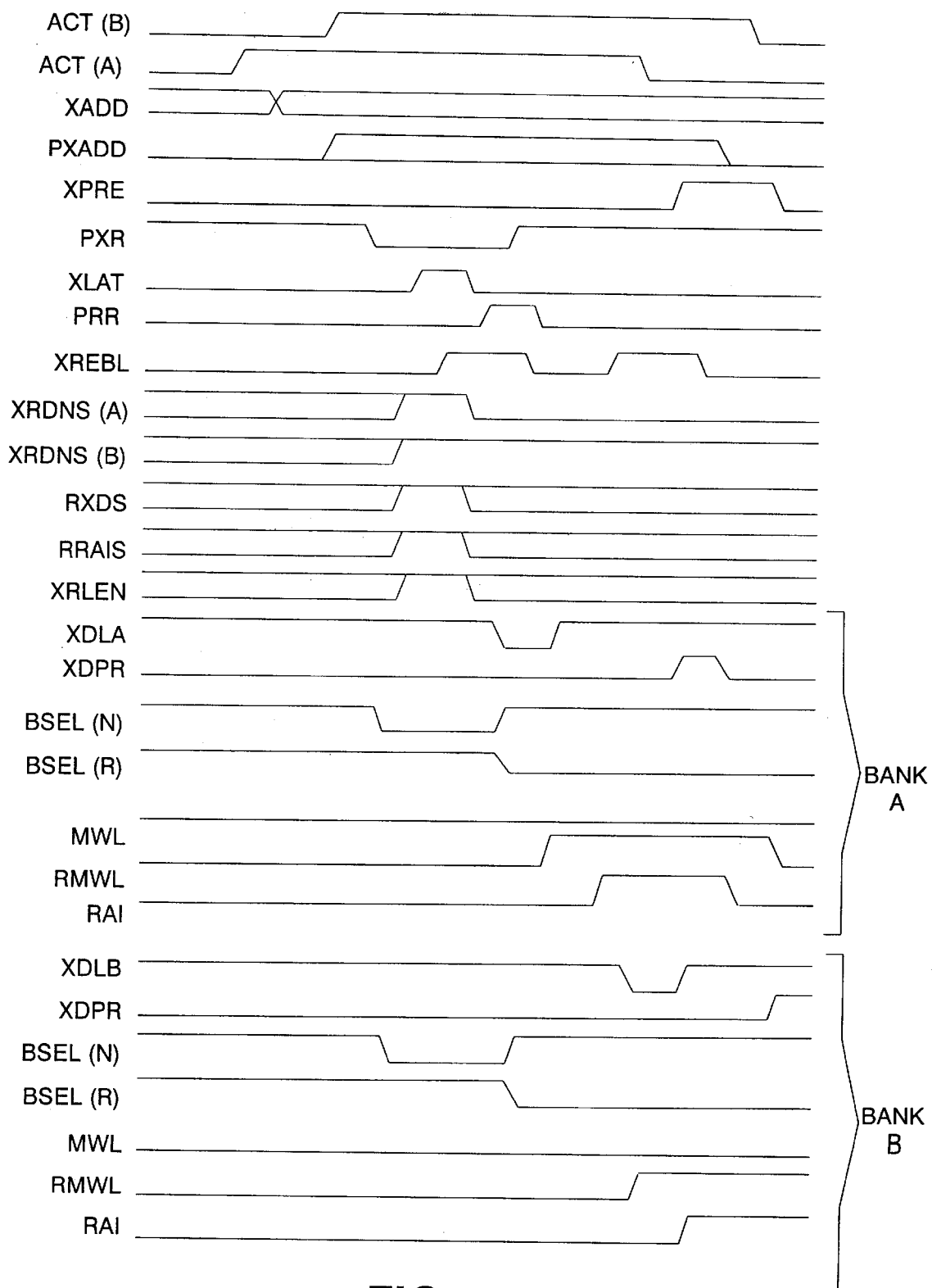
FIG. 27 is a timing chart illustrative of operation of the semiconductor memory device according to the fourth embodiment.

Fourth Embodiment:

FIG. 26 shows a timing control circuit in a semiconductor memory device according to a fourth embodiment of the present invention. FIG. 27 shows a timing chart illustrative of operation of the semiconductor memory device according to the fourth embodiment.

In general, each of the banks of the semiconductor memory device is rendered active when an active command is inputted, and inactive when a precharge command is inputted. The active commands include an active command ACT A for the bank A and another active command ACT B for the bank B, and the precharge commands include a precharge command PRE A for the bank A and another precharge command PRE B for the bank B.

In a synchronous DRAM, data is read from and written in the banks A, B at such timing that the banks A, B are rendered active simultaneously. Therefore, the above commands are inputted irrespective of the states of the different banks. A RAS cycle trC that is an interval at which active commands are inputted to one bank is about 90 ns, and a RAS-to-RAS delay $t_{rrd}$ that is an interval at which active commands are inputted to different banks is about 20 ns.

Inasmuch as each of the defective address agreement signals XREBL is shared by the banks A, B, as long as an active command for one bank is active and the defective address agreement signal XREBL is temporarily active, an active command for the other bank cannot be made effective. For example, after the active command ACT A is inputted and until the precharge command PRE A is inputted, the defective address agreement signal XREBL is active. If the active command ACT B is inputted in this period, this active command ACT B is not accepted and cannot make the bank B active.

The semiconductor memory device according to the fourth embodiment is designed to solve the above problem, and allows a defective memory cell to be normally replaced with a redundant memory cell even when periods in which the banks A, B are active overlap each other.

The semiconductor memory device according to the fourth embodiment is similar to the semiconductor memory devices according to the previous embodiments except that it additionally has a timing control circuit 10 shown in FIG. 26.

As shown in FIG. 26, the timing control circuit 10 comprises delay circuits 11 and 15, inverters 12, 14, 16 and 17, and a NAND gate 13. When ACT (A) becomes active (high), a one-shot pulse signal whose duration is determined by the delay circuit 11 is outputted as a redundant circuit latch signal XLAT, and a one-shot pulse signal that is delayed by a time determined by the delay circuit 15 after the redundant circuit latch signal XLAT has been outputted is outputted as PRR.

The defective address agreement signal XREBL is made active by XLAT, and inactive by PRR.

ACT (B) which is a signal indicating that the bank B is active is similarly inputted to the timing control circuit 10.

Operation of the semiconductor memory device according to the fourth embodiment will be described below with reference to FIG. 27. The timing chart shown in FIG. 27 indicates operation when the bank B becomes active after the bank A becomes active and before bank A becomes inactive.

When the active command ACT A is inputted, ACT (A) becomes active, and the timing control circuit 10 outputs the redundant circuit latch signal XLAT. When the redundant circuit latch signal XLAT is outputted, the defective address agreement signal XREBL becomes active. Since the timing control circuit 10 outputs PRR a certain time after the redundant circuit latch signal XLAT is outputted, the defective address agreement signal XREBL becomes inactive.

When the active command ACT B is inputted, ACT (B) becomes active, and the timing control circuit 10 outputs XLAT, PRR. The defective address agreement signal XREBL becomes inactive a certain time after it has become active.

In the fourth embodiment, after the defective address agreement signal XREBL shared by the banks has become active for a certain time, it becomes inactive. Therefore, a defective memory cell can be normally replaced with a redundant memory cell even when periods in which the banks A, B are active overlap each other.

Figure 28:
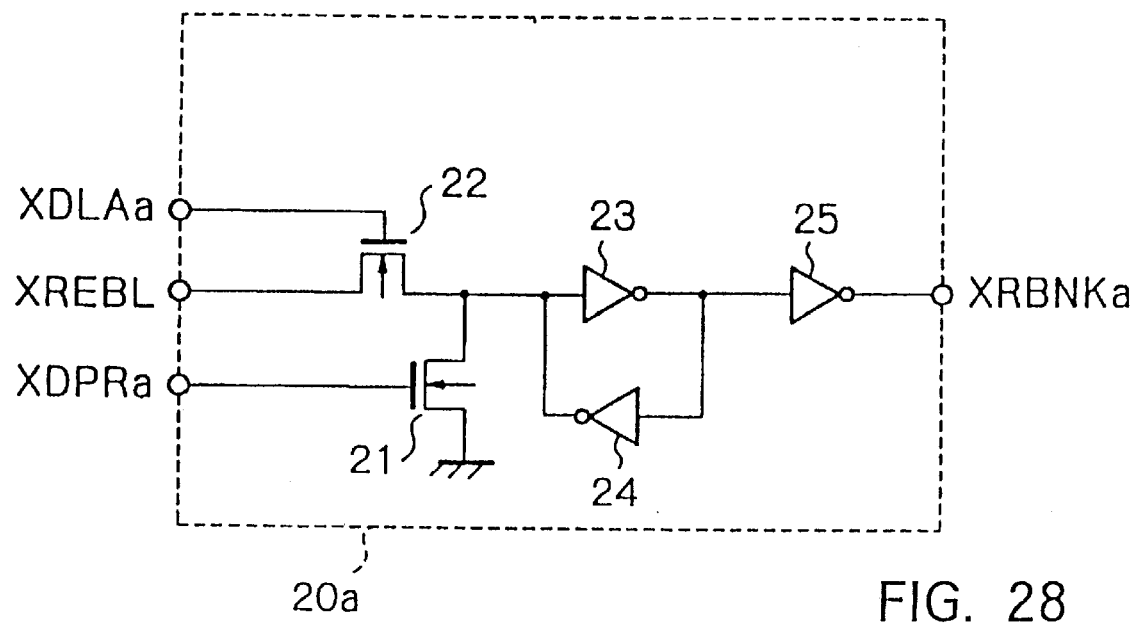
FIG. 28 is a circuit diagram of a defective address agreement signal latch circuit in a semiconductor memory device according to a fifth embodiment of the present invention.

Fifth Embodiment:

As with the fourth embodiment, the semiconductor memory device according to the fifth embodiment also allows a defective memory cell to be normally replaced with a redundant memory cell even when periods in which the banks A, B are active overlap each other. The semiconductor memory device according to the fifth embodiment is similar to the semiconductor memory devices according to the previous embodiments except that it additionally has defective address agreement signal latch circuits 20a, 20b shown in FIG. 28.

The defective address agreement signal latch circuits 20a, 20b latch the defective address agreement signal XREBL and output the latched signals as XRBNKa, XRBNKb, respectively.

When active commands ACT A, B are inputted, the signals XREBL subsequently become active for a certain time. When the active command ACT A is inputted, the defective address agreement signal latch circuit 20a outputs XDLAa. When the precharge command PRE A is inputted, the circuit 20a outputs XDPRa. When the active command ACT B is inputted, the defective address agreement signal latch circuit 20b outputs a latch signal XDLAb. When the precharge command PRE B is inputted, the circuit 20b outputs XDPRb.

The defective address agreement signal latch circuit 20a comprises n-channel MOS transistors 21 and 22, and inverters 23 to 25.

When the row decoder address latch signal XDLA becomes active, the n-channel MOS transistor 22 is turned on to output XREBL to the input terminal of the inverter 23. When the row decoder precharge signal XDPR becomes active, the n-channel MOS transistor 21 is turned on, making low the input to the inverter 23. The input to the inverter 23 is made low in order to make the output state of XRBNKa low, i.e., inactive.

The defective address agreement signal latch circuit 20b is identical in structure and operation to the defective address agreement signal latch circuit 20a.

Figure 29:
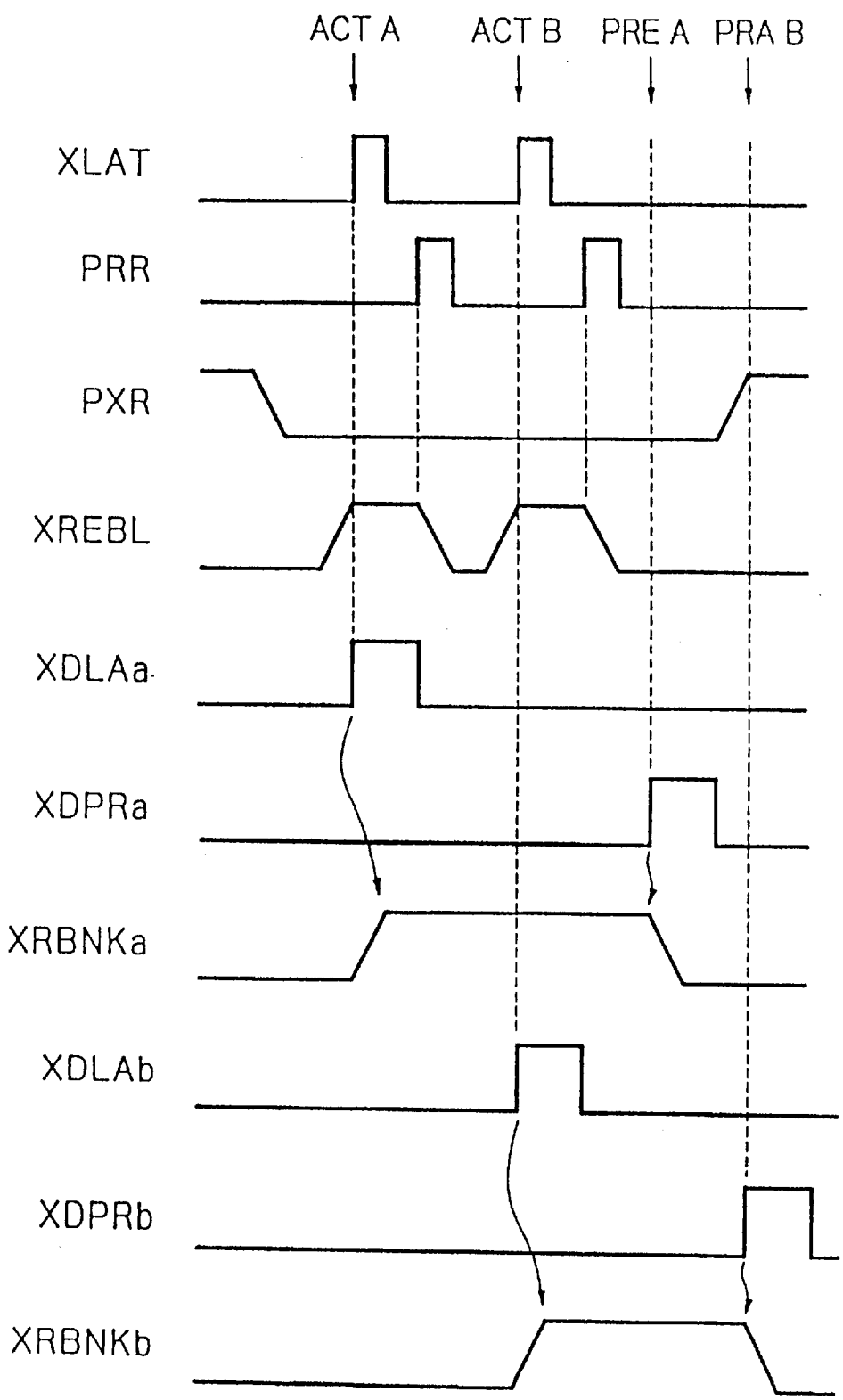
FIG. 29 is a timing chart illustrative of operation of a semiconductor memory device according to a fifth embodiment of the present invention.

Operation of the semiconductor memory device according to the fifth embodiment will be described below with reference to FIG. 29. The timing chart shown in FIG. 29 indicates operation when the bank B becomes active after the bank A becomes active and before the bank A becomes inactive.

When the active command ACT A is inputted, XREBL becomes active, and the latch signal XDLAa is outputted. Therefore, in the defective address agreement signal latch circuit 20a, XREBL is latched, and XRBNKa becomes active.

Then, when the active command ACT B is inputted, the latch signal XDLAb is outputted. In the defective address agreement signal latch circuit 20b, XREBL is latched, and XRBNKb becomes active.

When the precharge command PRE A is inputted, a redundant circuit precharge signal XDPRa is outputted. In the defective address agreement signal latch circuit 20a, XRBNKa becomes inactive.

Finally, when the precharge command PRE B is inputted, a redundant circuit precharge signal XDPRb is outputted. In the defective address agreement signal latch circuit 20b, XRBNKb becomes inactive.

In the semiconductor memory device according to the fifth embodiment, the defective address agreement signal XREBL is latched by the defective address agreement signal latch circuits 20a, 20b provided in respective banks as signals XDLAa, XDLAb, and the latched signals are reset respectively by the active commands PRE A, PRE B. Therefore, the banks A, B can be rendered active independently of each other.

In the above preferred embodiments of the present invention, the replacement of a defective memory cell at a row address has been illustrated. However, the principles of the present invention are also applicable to a semiconductor memory device for the replacement of a defective memory cell at a column address.

In each of the above embodiments, the redundancy decoder XRED stores the address of a defective memory cell to be replaced based on whether fuses are cut off or not. However, the principles of the present invention are also applicable to any nonvolatile memory means where addresses can be stored even when the power supply is turned off.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device comprising:
   a plurality of ordinary memory cells;
   means for activating said ordinary memory cells in response to addresses applied from an external source;
   a plurality of redundant memory cells, wherein each of s aid redundant memory cells provides seven terminals, one of the seven terminals is connected to a subword line selecting circuit through an inverter for providing a redundant replacement selecting signals;
   first storage mans for storing an address of a defective memory cell among said ordinary memory cells;
   comparing means for comparing the addresses applied from the external source and the address of the detective memory cell with each other, wherein the number of bits to be compared by said comparing means is variable;
   second storage means for storing the number of bits to be compared by said comparing means or the number of bits not to be compared by said comparing means;
   means for activating a redundant memory cell in response to an output from said comparing means and/or preventing the ordinary memory cells from being activated;
   first transfer means for transferring stored data of said second storage means to said means for activating a redundant memory cell based on the output from said comparing means;
   said comparing means comprising means for comparing all or part of bits of the addresses applied from the external source and the stored address of the defective memory cell with each other; and
   a plurality of divided memory cell arrays which are independently operable according to address signals applied from the external sources, each of said memory cell arrays having said plurality of redundant memory cells.

2. A semiconductor memory device according to claim 1, further comprising:
   third storage means XRDN for storing which memory cell array contains a defective memory cell to be replaced, among the divided memory cell arrays;
   said comparing means comprising means for comparing stored data of said third storage means and a memory cell array selecting signal applied from the external source.

3. A semiconductor memory device according to claim 1, further comprising:
   a plurality of fourth storage means corresponding to the comparing means, for storing which redundant memory cell is to replace the defective memory cell among the divided memory cell arrays; and
   second transfer means XRDN for transferring stored data of said fourth storage means to said means for activating a redundant memory cell based on the output from said comparing means.

4. A semiconductor memory device according to claim 3, wherein said fourth storage means comprise N-digit binary data storage means.

5. A semiconductor memory device according to claim 3, wherein said second transfer means is connected to said plurality of fourth storage means, and comprises wired-OR nodes for transferring N-digit binary data.

6. A semiconductor memory device according to claim 3, wherein said means for activating a redundant memory cell comprises:
   means for decoding data transferred by said second transfer means; and
   means for latching the data transferred by said second transfer means or the decoded data.

7. A semiconductor memory device according to claim 3, wherein said means for activating a redundant memory cell selects the numbers of bits not to be compared, as indicated by said transfer means, from among bits of the address applied from the external source, the semiconductor memory device further comprising selecting means for selecting the number of other bits from among bits of the data transferred by the second transfer means.

8. A semiconductor memory device comprising:

a plurality of banks each having an ordinary memory cell block comprising a plurality of memory cells and a plurality of redundant memory cells for replacing a defective memory cell present in said ordinary memory cell block, said banks being capable of reading and writing data independently of each other;

a plurality of redundancy decoders shared by said banks, for storing an address of said defective memory cell, comparing an address indicated by an inputted address signal with the stored address of said defective memory cell, and outputting a defective address agreement signal when the compared addresses agree with each other;

replacement memory cell storage means for storing addresses of the redundant memory cells to replace the defective memory cell, and activating a redundant memory cell to replace the defective memory cell when the defective address agreement signal is inputted from each of said redundancy decoders; and a timing control circuits for outputting a latch signal to latch said defective address agreement signal when a command to make a bank active is inputted, and outputting a signal a predetermined time after the latch signal is outputted, wherein said redundancy decoder and said redundancy memory cell are precharged after the predetermined time lapsed, regardless of the state of a corresponding bank.

9. A semiconductor memory device comprising:

a plurality of banks each having an ordinary memory cell block comprising a plurality of memory cells and a plurality of redundant memory cells for replacing a defective memory cell present in said ordinary memory cell block, said banks being capable of reading and writing data independently of each other;

a plurality of redundancy decoders shared by said banks, for storing an address of said defective memory cell, comparing an address indicated by an inputted address signal with the stored address of said defective memory cell, and outputting a defective address agreement signal when the compared addresses agree with each other;

replacement memory cell storage means for storing addresses of the redundant memory cells to replace the defective memory cell, and activating a redundant memory cell to replace the defective memory cell when the defective address agreement signal is inputted from each of said redundancy decoders;

a plurality of timing control circuits associated respectively with said banks, for outputting a latch signal to latch said defective address agreement signal when a command for making the corresponding banks active is inputted, and outputting a redundant circuit precharge signal to reset said defective address agreement signal when a command for precharging the corresponding banks is inputted, wherein said redundancy decoder and said redundancy memory cell are precharged after a predetermined time lapsed, regardless of the state of a corresponding bank; and a plurality of defective address agreement signal latch circuits for latching said defective address agreement signal from said plurality of redundancy decoders and outputting the latched defective address agreement signal when said latch signal with respect to the corresponding banks is outputted by said plurality of timing control circuits, and resetting the latched defective address agreement signal when said redundant circuit precharge signal with respect to the corresponding banks is outputted by said plurality of timing control circuits.

* * * * *